United States Patent
Roh

(10) Patent No.: US 12,324,354 B2
(45) Date of Patent: Jun. 3, 2025

(54) THERMOELECTRIC MODULE AND POWER GENERATING APPARATUS COMPRISING SAME

(71) Applicant: LG INNOTEK CO., LTD., Seoul (KR)

(72) Inventor: Myoung Lae Roh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 158 days.

(21) Appl. No.: 18/024,798

(22) PCT Filed: Sep. 7, 2021

(86) PCT No.: PCT/KR2021/012144
§ 371 (c)(1),
(2) Date: Mar. 6, 2023

(87) PCT Pub. No.: WO2022/050820
PCT Pub. Date: Mar. 10, 2022

(65) Prior Publication Data
US 2024/0032428 A1   Jan. 25, 2024

(30) Foreign Application Priority Data
Sep. 7, 2020   (KR) .................... 10-2020-0113877

(51) Int. Cl.
*H10N 10/817*   (2023.01)
*H10N 10/17*   (2023.01)

(52) U.S. Cl.
CPC ........... *H10N 10/817* (2023.02); *H10N 10/17* (2023.02)

(58) Field of Classification Search
CPC .............................. H10N 10/817; H10N 10/17
See application file for complete search history.

(56) References Cited

U.S. PATENT DOCUMENTS

| | | | |
|---|---|---|---|
| 2013/0014516 A1* | 1/2013 | Yang ...................... | H10N 10/13 136/203 |
| 2013/0061900 A1* | 3/2013 | Tachibana .............. | H10N 10/17 136/203 |

(Continued)

FOREIGN PATENT DOCUMENTS

| JP | 2000-183409 | 6/2000 |
|---|---|---|
| JP | 2013008737 A * | 1/2013 |

(Continued)

OTHER PUBLICATIONS

Akiyama, JP-2013008737-A, Machine Translation (Year: 2013).*
International Search Report dated Dec. 15, 2021 issued in Application No. PCT/KR2021/012144.

*Primary Examiner* — Devina Pillay
(74) *Attorney, Agent, or Firm* — KED & ASSOCIATES, LLP

(57) ABSTRACT

According to an embodiment, a thermoelectric module is disclosed, the thermoelectric module comprising: a first heat-conducting member; a second heat-conducting member; a thermoelectric element disposed between the first heat-conducting member and the second heat-conducting member; a first sealing member disposed outside the thermoelectric element; and a second sealing member disposed outside the first sealing member, wherein the thermoelectric element includes a first substrate, a second substrate facing the first substrate, and a semiconductor structure disposed between the first substrate and the second substrate, and the first sealing member is disposed between the upper surface of the first substrate and the lower surface of the second substrate, and includes a convex side surface toward the semiconductor structure, and the second sealing member is in contact with the side surface of the first substrate and the side surface of the second substrate, and includes a gap (Continued)

between the second sealing member and the convex side surface of the first sealing member.

19 Claims, 15 Drawing Sheets

(56) References Cited

U.S. PATENT DOCUMENTS

| | | | | |
|---|---|---|---|---|
| 2015/0311420 A1* | 10/2015 | Akabane | ................ | H10N 10/17 |
| | | | | 136/203 |
| 2016/0133815 A1 | 5/2016 | Akabane | | |
| 2018/0172325 A1 | 6/2018 | Inaba et al. | | |
| 2019/0081226 A1* | 3/2019 | Hamano | ................ | H10N 10/17 |

FOREIGN PATENT DOCUMENTS

| | | |
|---|---|---|
| KR | 10-1519071 | 5/2015 |
| KR | 10-2095243 | 4/2020 |
| KR | 10-2020-0077181 | 6/2020 |

\* cited by examiner

THERMOELECTRIC MODULE AND POWER GENERATING APPARATUS COMPRISING SAME

CROSS-REFERENCE TO RELATED PATENT APPLICATIONS

This application is a U.S. National Stage Application under 35 U.S.C. § 371 of PCT Application No. PCT/KR2021/012144, filed Sep. 7, 2021, which claims priority to Korean Patent Application No. 10-2020-0113877, filed Sep. 7, 2020, whose entire disclosures are hereby incorporated by reference.

TECHNICAL FIELD

The present disclosure relates to a thermoelectric module and a power generating apparatus including the same, and more particularly, to a thermoelectric module using a temperature difference between a low-temperature part and a high temperature part of a thermoelectric element and a power generating apparatus including the same.

BACKGROUND ART

A thermoelectric phenomenon is a phenomenon occurring due to movement of electrons and holes in a material and means direct energy conversion between heat and electricity.

A thermoelectric element is a generic term for elements in which the thermoelectric phenomenon is used and has a structure in which P-type thermoelectric materials and N-type thermoelectric materials are bonded between metal electrodes to form PN junction pairs.

The thermoelectric elements may be classified into elements which use a change in electrical resistance according to a change in temperature, elements which use the Seebeck effect in which an electromotive force is generated due to a difference in temperature, and elements which use the Peltier effect in which heat absorption or heating occurs due to a current.

The thermoelectric elements are being variously applied to home appliances, electronic components, communication components, and the like. For example, the thermoelectric elements may be applied to cooling devices, heating devices, power generating apparatuses, and the like. Accordingly, the demand for thermoelectric performance of the thermoelectric elements is gradually increasing.

When the thermoelectric element is applied to a power-generating apparatuses for generating electricity, a first fluid may flow toward a low-temperature part of the thermoelectric element, and a second fluid having a higher temperature than the first fluid may flow toward a high-temperature part of the thermoelectric element. Accordingly, electricity may be generated by a temperature difference between the low-temperature part and the high-temperature part of the thermoelectric element.

DISCLOSURE

Technical Problem

A technical problem to be achieved by the present disclosure is to provide a thermoelectric module using a temperature difference between a low-temperature part and a high-temperature part of a thermoelectric element and a power generating apparatus including the same.

In particular, a technical problem to be achieved by the present disclosure is to provide a thermoelectric module or power generating apparatus in which reliability is not deteriorated by disposing a plurality of sealing members at different positions in the thermoelectric module.

Technical Solution

A thermoelectric module according to an embodiment of the present disclosure may include a first heat-conducting member; a second heat-conducting member; a thermoelectric element disposed between the first heat-conducting member and the second heat-conducting member; a first sealing member disposed outside the thermoelectric element; and a second sealing member disposed outside the first sealing member, wherein the thermoelectric element may include a first substrate, a second substrate facing the first substrate, and a semiconductor structure disposed between the first substrate and the second substrate, the first sealing member may be disposed between the upper surface of the first substrate and the lower surface of the second substrate, and include a convex side surface toward the semiconductor structure, the second sealing member may be in contact with the side surface of the first substrate and the side surface of the second substrate, and a gap may be provided between the second sealing member and the convex side surface of the first sealing member.

The thermoelectric element further may include a first insulating layer disposed on the first substrate and a second insulating layer disposed on the first insulating layer, and the first sealing member may be in contact with the first insulating layer and the second insulating layer.

The first sealing member may include a first region in contact with the first insulating layer; and a second region in contact with the second insulating layer.

The first insulating layer may include a first insulating part which is vertically overlapped with the second insulating layer and a second insulating part which is not vertically overlapped with the second insulating layer, and the first region of the first sealing member may be positioned in the second insulating part, and the second region of the first sealing member may be positioned in the first insulating part.

The thermoelectric module may further include a third sealing member disposed outside the second sealing member, wherein the third sealing member may be in contact with the first heat-conducting member and the second heat-conducting member, and the first sealing member, the second sealing member and the third sealing member may be spaced apart from each other.

The first sealing member and the second sealing member may include the same material, the first sealing member and the third sealing member may include different materials, and the third sealing member may include urethane.

The first heat-conducting member may be connected to a first flow path, the second heat-conducting member may be connected to a second flow path, and the temperatures of the fluids flowing in the first flow path and the second flow path may be different from each other.

An outer side surface of the first sealing member may be concave outward toward the semiconductor structure.

The upper surface of the second insulating layer may include a concave portion concave toward the second substrate, and the outer side surface of the first sealing member and the upper surface of the second insulating layer may be concave in a direction perpendicular to each other.

A height of the first sealing member, a height of the second sealing member, and a height of the third sealing member may be different from each other.

The thermoelectric module may further include an electrode connection part disposed on the first substrate and electrically connected to the first electrode; and a conductive wire part connected to the electrode connection part and extending outside the first substrate.

The electrode connection part may include an overlapping portion, which is vertically overlapped with the first substrate and the second substrate, and the first sealing member may at least partially surround the overlapping portion.

The thermoelectric module may further include a connection unit disposed on the electrode connection part and electrically connected to the conductive wire part, wherein the second sealing member may surround the connection unit.

The second sealing member may be in contact with at least a portion of the upper surface of the first substrate.

The third sealing member may be in contact with the first heat-conducting member and the second heat-conducting member.

A width of the third sealing member may be greater than a width of the first sealing member.

A width of the second sealing member may be greater than the width of the first sealing member.

The second sealing member may extend from the outer side surface of the first substrate to the upper surface of the first heat-conducting member, and extend from the outer side surface of the second substrate to the lower surface of the second heat-conducting member.

The second sealing member may couple the thermoelectric element, the first heat-conducting member, and the second heat-conducting member.

The third sealing member may couple the first heat-conducting member and the second heat-conducting member.

Advantageous Effects

According to an embodiment of the present disclosure, it is possible to obtain a power generating apparatus having a thermoelectric module that may be simple to assemble and have excellent power generation performance in accordance with an improvement in temperature difference.

In addition, according to an embodiment of the present disclosure, a thermoelectric module having improved reliability may be provided.

In particular, according to an embodiment of the present disclosure, the process of disposing shield members on a thermoelectric module may be simple, and the thermoelectric module may be protected from moisture, heat, or other contaminants.

In addition, the thermoelectric element or thermoelectric module according to an embodiment of the present disclosure may be applied not only to small-sized applications but also to large-scale applications such as waste heat pipes such as heat transfer pipes, rainwater pipes, and smelting pipes, vehicles, ships, steel mills, and incinerators.

BEST MODE

Figure 1:
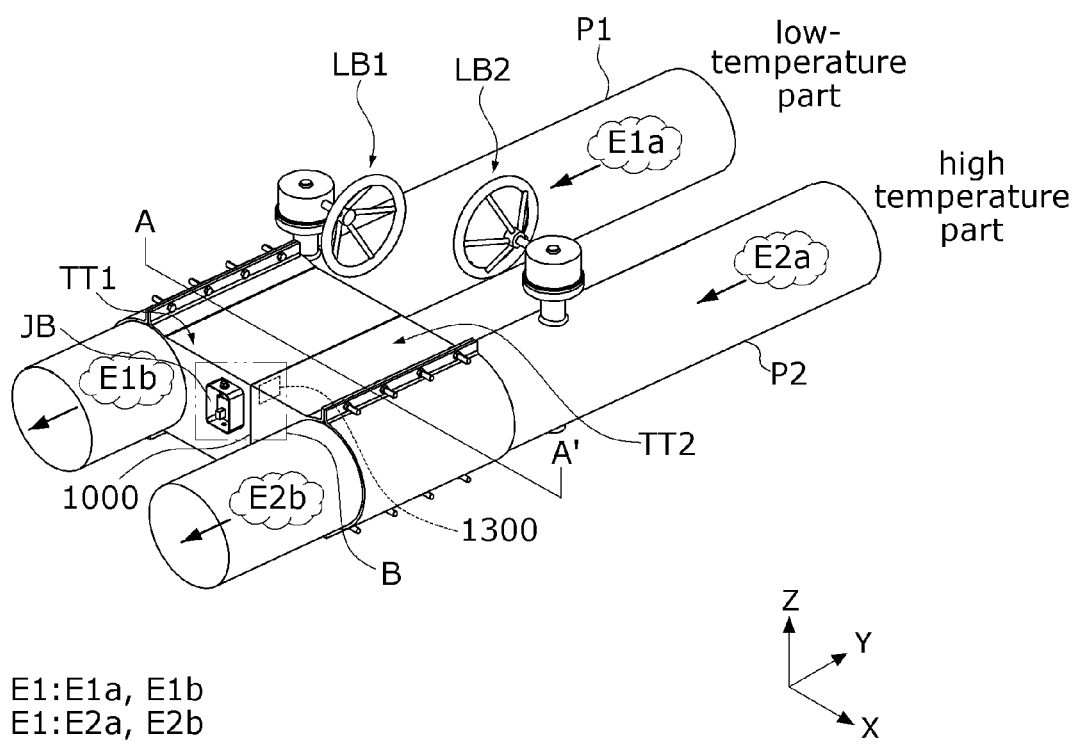
FIG. 1 is a perspective view of a power generating apparatus including a thermoelectric module according to an embodiment of the present disclosure.

Hereinafter, a preferred embodiment of the present disclosure will be described in detail with reference to the accompanying drawings.

However, the technical spirit of the present disclosure is not limited to some embodiments which will be described and may be embodied in various forms, and one or more elements in the embodiments may be selectively coupled and replaced to be used within the scope of the technical spirit of the present disclosure.

In addition, the terms used in the embodiments of the present disclosure (including technical and scientific terms), may be interpreted with meanings that are generally understood by those skilled in the art unless particularly defined and described, and terms which are generally used, such as terms defined in a dictionary, may be understood in consideration of their contextual meanings in the related art.

Further, the terms used in the embodiments of the present disclosure are provided only to describe embodiments of the present disclosure and not for purposes of limitation.

In the present specification, unless clearly indicated otherwise by the context, singular forms include the plural forms thereof, and in a case in which "at least one (or one or more) among A, B, and C" is described, this may include at least one combination among all combinations which may be combined with A, B, and C.

In addition, terms such as first, second, A, B, (a), (b), and the like may be used to describe elements of the embodiments of the present disclosure.

These terms are only provided to distinguish the elements from other elements, and the essence, sequence, order, or the like of the elements are not limited by the terms.

In addition, when an element is described as being "connected", "coupled", or "linked" to another element, the element may include not only a case of being directly connected, coupled, or linked to another element but also a case of being connected, coupled, or linked to another element by still another element between the element and another element.

Further, when an element is described as being formed "on (above)" or "under (below)" another element, the term "on (above)" or "under (below)" includes both of a case in which two elements are in direct contact with each other or a case in which one or more elements are (indirectly) disposed between two elements. In addition, when an element is described as being disposed "on or under" another element, such a description may include a case in which the element is disposed at an upper side or a lower side with respect to another element.

First of all, the thermoelectric apparatus (or thermoelectric module) of the present disclosure may be used as a power-generating apparatus or a power-generating system→power generation system including the power-generating apparatus. For example, the power-generating system may include a power generating apparatus (including a thermoelectric module or thermoelectric element) and a fluid pipe, and the fluid flowing into the fluid pipe may be a heat source generated in a waste heat pipe such as a heat transfer pipe, a rainwater pipe, or a smelting pipe, but is not limited thereto.

For example, the fluid pipe may include a first fluid pipe and a second fluid pipe through which a fluid having a higher temperature than the first fluid pipe flows and the thermoelectric module may be disposed between the first fluid pipe and the second fluid pipe. For example, the temperature of the fluid flowing in the first fluid pipe may be 80° C. or less, preferably 60° C. or less, more preferably 50° C., and the temperature of the fluid flowing in the second fluid pipe may be 100° C. or more, preferably 200° C. or more, more preferably 220° C. to 250° C. However, it is not limited to this example, and may be variously applied depending on the temperature difference between the low temperature part and the high temperature part of the thermoelectric element. Further, the power-generating apparatus may be disposed adjacent to the fluid pipe to generate power using energy of the fluid.

Figure 2:
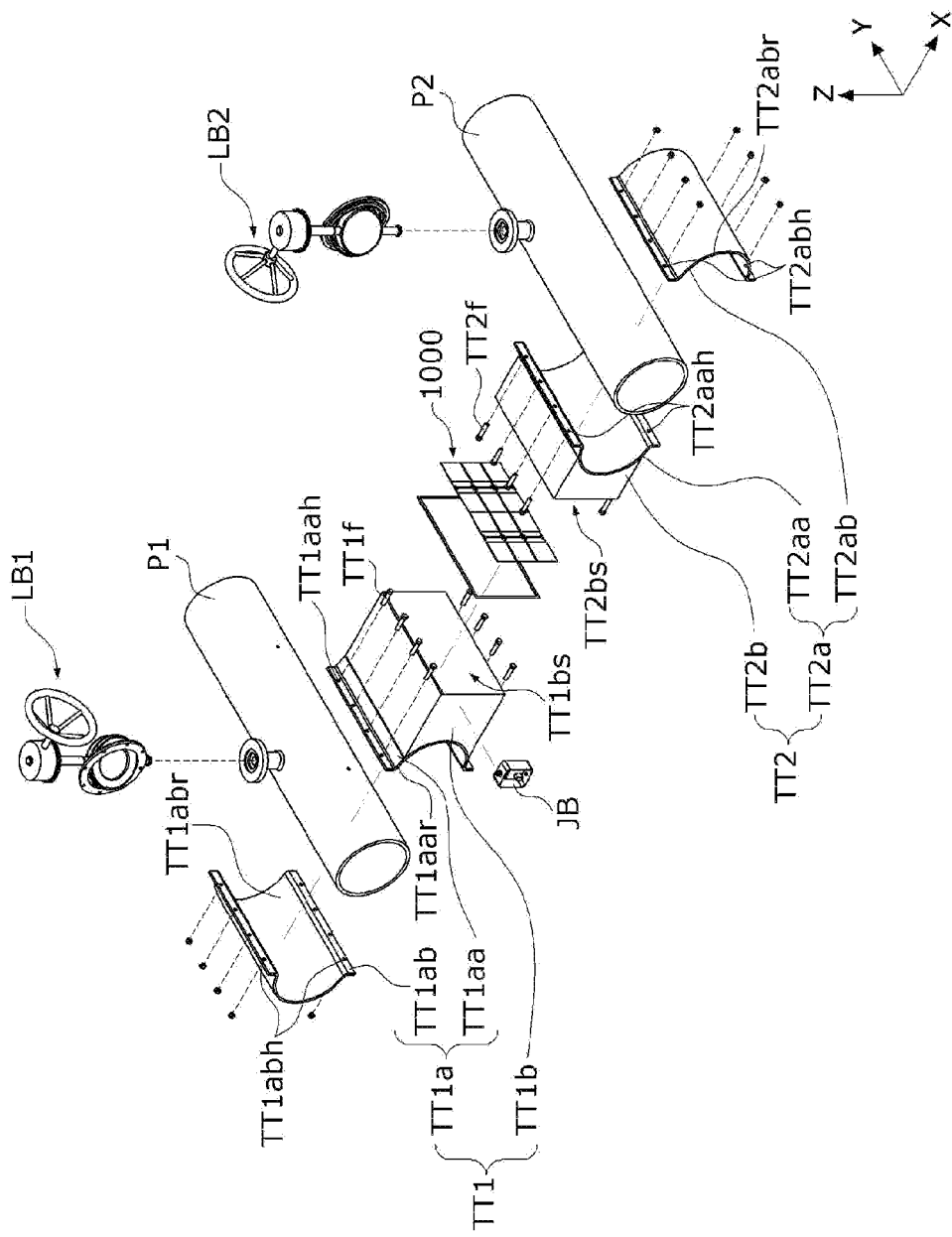
FIG. 2 is an exploded perspective view of a power generating apparatus including a thermoelectric module according to an embodiment of the present disclosure.
Figure 3A:
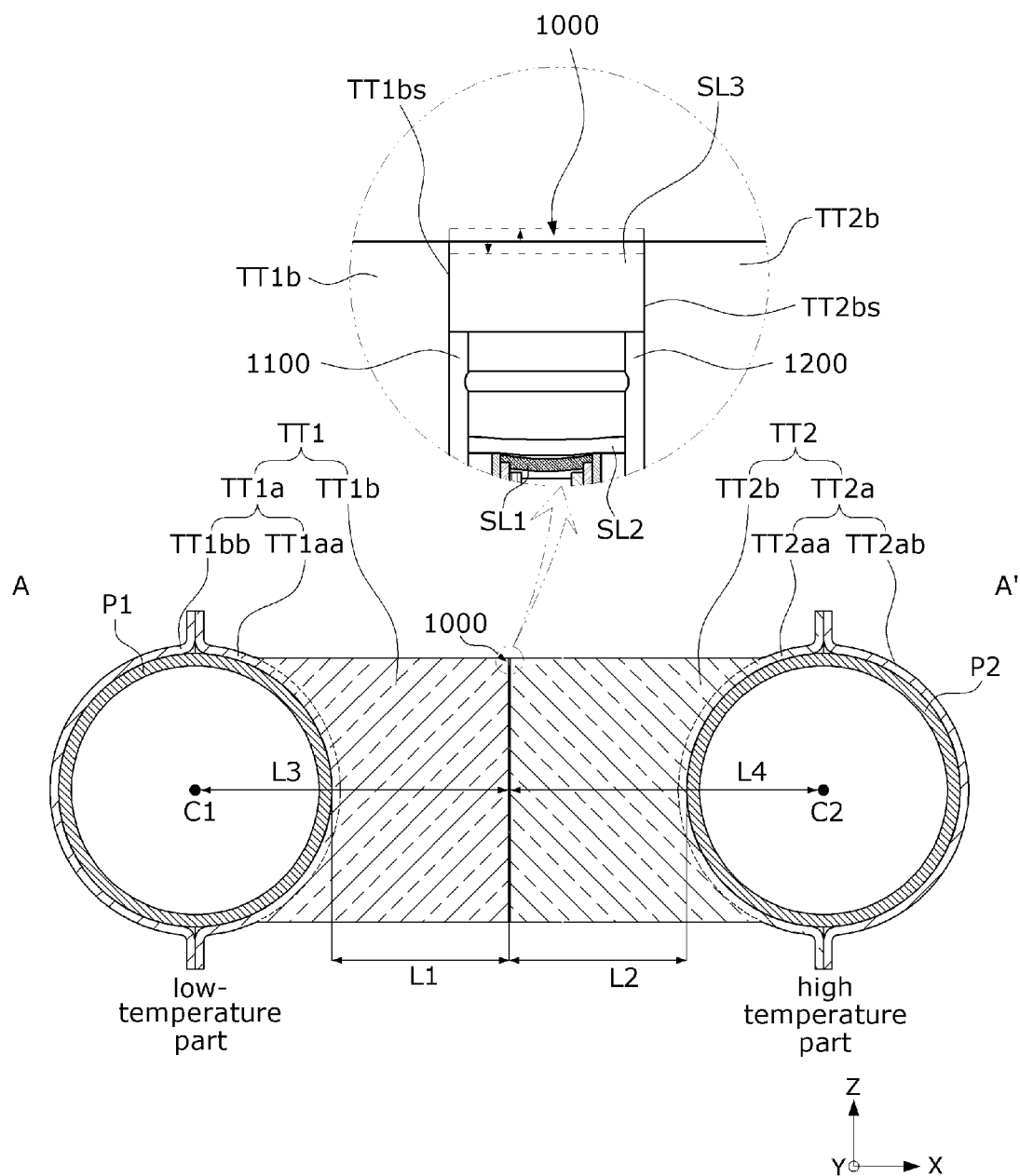
FIG. 3A is a cross-sectional view taken along the line A-A' in FIG. 1.
Figure 3B:
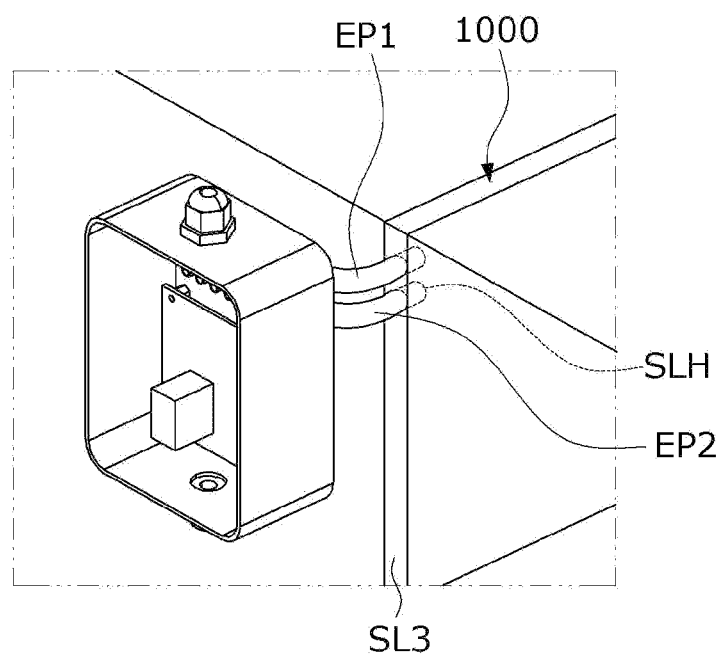
FIG. 3B is an enlarged view of the part B in FIG. 1.

FIG. 1 is a perspective view of a power generating apparatus including a thermoelectric module according to an embodiment of the present disclosure, FIG. 2 is an exploded perspective view of a power generating apparatus including a thermoelectric module according to an embodiment of the present disclosure, FIG. 3A is a cross-sectional view taken along the line A-A' in FIG. 1, and FIG. 3B is an enlarged view of the part B in FIG. 1.

Referring to FIGS. 1 and 2, a power generating apparatus or power generating system including a thermoelectric module 1000 according to an embodiment of the present disclosure may include a first flow path P1, a second flow path P2, and a first adjustment part LB1, a second adjustment part LB2, and the thermoelectric module 1000.

The first flow path P1 and the second flow path P2 may be pipes having spaces in which fluids E1 and E2 may be moved. The first fluid E1 may be moved in a predetermined direction in the first flow path P1. In addition, the second fluid E2 may be moved in a predetermined direction in the second flow path P2. For example, the first fluid E1 may be moved in a direction opposite to a second direction (Y-axis direction) or in the second direction. Similarly, the second fluid E2 of the second flow path P2 may be moved in a direction opposite to the second direction (Y-axis direction) or in the second direction (Y-axis direction).

In addition, the first flow path P1 and the second flow path P2 may be spaced apart from each other in a first direction (X-axis direction). In this specification, the first direction (X-axis direction) may be a direction from the first flow path P1 toward the second flow path P2 or a direction from a first conductive part TT1 toward a second conductive part TT2 described later. In addition, the second direction (Y-axis direction) may be an extension direction of the first flow path P1 or the second flow path P2 in a direction perpendicular to the first direction (X-axis direction). Further, a third direction (Z-axis direction) may be a direction perpendicular to the first direction (X-axis direction) and the second direction (Y-axis direction). Here, each of the X-axis direction, Y-axis direction, and Z-axis direction is shown as being perpendicular to each other, but is not limited thereto, and each of X-axis direction, Y-axis direction, and Z-axis direction may have a predetermined angle with each other. In addition, in the embodiment, the first and second flow paths P1 and P2 are illustrated as circular in cross section along a plane YZ perpendicular to the first direction (X-axis direction), but are not limited thereto and may have various shapes.

In addition, the temperature of the first fluid E1 may be lower than that of the second fluid E2. Accordingly, the first flow path P1 may be a low-temperature part, and the second flow path P2 may be a high-temperature part. Thus, a first substrate of the thermoelectric element adjacent to the first flow path P1 and conducting heat from the first flow path P1 may become the low-temperature part, and a second substrate of the thermoelectric element adjacent to the second flow path P2 and conducting heat from the second flow path P2 may become the high-temperature. On the basis of the above, a description will be given as follows.

The first adjustment part LB1 may be coupled to the first flow path P1. The first adjustment part LB1 may adjust the amount of flow of the first fluid E1 in the first flow path P1. The first adjustment part LB1 is driven by a user's rotational force, and the first flow path P1 may be opened or closed, or its area may be reduced or increased in cross section (YZ plane). Accordingly, for example, when the first fluid E1 flows in the opposite direction to the second direction (Y-axis direction) as shown in the drawing, the amount of the first fluid E1a before passing through the first adjustment part LB1 and the amount of the first fluid E1b after passing through the first adjustment part LB1 may be adjusted equal to or different from each other.

Similarly, the second adjustment part LB2 may be coupled to the second flow path P2. The second adjustment part LB2 may adjust the amount of flow of the second fluid E2 in the second flow path P2. The second adjustment part LB2 is driven by a user's rotational force, and the second flow path P2 may be opened or closed, or its area may be reduced or increased in cross section (YZ plane). Accordingly, for example, when the second fluid E2 flows in the opposite direction to the second direction (Y-axis direction) as shown in the drawing, the amount of the second fluid E2a before passing through the second adjustment part LB2 and the amount of the second fluid E2b after passing through the second adjustment part LB2 may be adjusted equal to or different from each other.

The first conductive part TT1 may extend from the first flow path P1 through which the first fluid E1 is moved. For example, the first conductive part TT1 may be connected to the first flow path P1 to transfer heat from the first flow path P1.

In addition, a second conductive part TT2 may be in contact with the second flow path P2 through which the second fluid E2 having a temperature higher than that of the first fluid E1 is moved. For example, the second conductive part TT2 may extend from the second flow path P2 and be connected to the second flow path P2 to transfer heat from the second flow path P2.

In addition, the thermoelectric module 1000 may be disposed between the first conductive part TT1 and the second conductive part TT2. The thermoelectric module 1000 may be in contact with the first conductive part TT1 and the second conductive part TT2. That is, the thermoelectric module 1000 may receive heat from each of the first and second flow paths P1 and P2. For example, a first heat-conducting member of the thermoelectric module 1000 may extend from the first flow path P1 having the low-temperature and may receive heat. And a second heat-conducting member of the thermoelectric module 1000 may extend from the second flow path P2 having the high-temperature and may receive heat from the second flow path P2.

The thermoelectric module 1000 may include a third sealing member surrounding outer sides of the first heat-conducting member and the second heat-conducting member. A detailed description of this will be explained later.

Further, the thermoelectric module 1000 may include a junction box JB disposed on its outside, for example, either the first conductive part TT1 or the second conductive part TT2. The junction box JB may be electrically connected to the thermoelectric element of the thermoelectric module 1000. An output voltage of the thermoelectric element may be determined according to a temperature difference between the low-temperature part and the high-temperature part, that is, a temperature difference between the first substrate and the second substrate and an internal resistance. In addition, a maximum power may differ depending on the output voltage, the internal resistance, and a load. Accordingly, the junction box JB may include a circuit part for setting the load to correspond to the internal resistance of the thermoelectric element. Thus, the maximum power may be transferred to the outside by electricity generation of the thermoelectric element. For example, the circuit part may transfer maximum power to the load by adjusting the load to be equal to the internal resistance of the thermoelectric element. In addition, the load may be electrically connected to an external device (e.g., a battery), and electrical energy generated by applying a voltage across the load to the external device may be charged to the external device.

Hereinafter, the first conducting part TT1 and the second conductive part TT2 will be described in detail.

The first conductive part TT1 may include a first clamp TT1*a* surrounding the first flow path P1 and a first extension part TT1*b* extending toward the thermoelectric module 1000 from the first clamp TT1*a*. Furthermore, the first conductive part TT1 may further include a first fastening member TT1*f* for improving the coupling force between the first clamp TT1*a* and the first flow path P1.

The first clamp TT1*a* may include a first-first clamp TT1*aa* and a first-second clamp TT1*ab*. The first-first clamp TT1*aa* and the first-second clamp TT1*ab* may be members divided from the first clamp TT1*a* into the plane YZ perpendicular to the first direction (X-axis direction). Accordingly, the first-first clamp TT1*aa* may be disposed between the first flow path P1 and the second flow path P2. Alternatively, the first-first clamp TT1*aa* may be positioned adjacent to the thermoelectric module 1000 compared to the first-second clamp TT1*ab*.

The first-first clamp TT1*aa* may have an inner side surface TT1*aar* having a shape corresponding to an outer surface of the first flow path P1. Accordingly, the inner side surface TT1*aar* of the first-first clamp TT1*aa* may be in contact with one surface of the first flow path P1 and may surround one surface of the first flow path P1.

In addition, the first-first clamp TT1*aa* may include a first-first hole TT1*aah* for coupling with the first-second clamp TT1*ab*. The first-first hole TT1*aah* may be positioned to an upper portion or lower portion of the first flow path P1.

The first-second clamp TT1*ab* may have an inner side surface TT1*abr* having a shape corresponding to an outer surface of the first flow path P1. Like the first-first clamp TT1*aa*, the inner side surface TT1*abr* of the first-second clamp TT1*ab* may be in contact with the other surface of the first flow path P1 and surround the other surface of the first flow path P1. Accordingly, the first-first clamp TT1*aa* and the first-second clamp TT1*ab* may surround the first flow path P1 while being in contact with the first flow path P1. As a result, the first-first clamp TT1*aa* and the first-second clamp TT1*ab* may receive energy (e.g., temperature) from the first fluid E1 in the first flow path P1.

In addition, the first-second clamp TT1*ab* may include a first-second hole TT1*abh* for coupling with the first-first clamp TT1*aa*. The first-second hole TT1*abh* may be positioned to the upper or lower portion of the first flow path P1. The first-first hole TT1*aah* and the first-second hole TT1*abh* may be positioned to be overlapped with each other in the first direction (X-axis direction). Further, the first-first hole TT1*aah* may be disposed to the upper or lower portion of the first flow path P1 to be overlapped in the third direction (Z-axis direction) or may be disposed to be partially misaligned. Similarly, the first-second holes TT1*abh* may be disposed to the upper or lower portion of the first flow path P1 to be overlapped in the third direction (Z-axis direction) or may be disposed to be partially misaligned.

In addition, the first fastening member TT1*f* may pass through the aforementioned first-first hole TT1*aah* and first-second hole TT1*abh*. Accordingly, a coupling bonding force between the first-first clamp TT1*aa* and the first-second clamp TT1*ab* is secured, and a fastening force between the first-first clamp TT1*aa* and the first flow path P1 or between the first-second clamp TT1*ab* and the first flow path P1 may be improved. That is, since the first conductive part may be easily fastened to the first flow path P1 or the second flow path P2 to be described later, the ease of assembly may be improved.

Furthermore, the first-first clamp TT1*aa* and the first-second clamp TT1*ab* may be made of a material with high thermal conductivity. For example, the first-first clamp TT1*aa* and the first-second clamp TT1*ab* may include metal.

The first extension part TT1*b* may extend in the first direction (X-axis direction) from the first-first clamp TT1*aa*. The first extension part TT1*b* may be integrally formed with the first-first clamp TT1*aa*. For example, the first-first clamp TT1*aa* and the first extension part TT1*b* may be integrally formed, and in a state in which the first-second clamp TT1*ab* is separated from the first-first clamp TT1*aa* and the first extension part TT1*b*, they may be coupled to each other through the first fastening member TT1*f*. Thus, the ease of assembly may be improved, as described above.

In addition, the first extension part TT1*b* may have a first end surface TT1*bs* facing the second conductive part TT2. The first end surface TT1*bs* may be in contact with the thermoelectric module 1000. Alternatively, a conducting pad made of a thermally conductive material may be additionally disposed between the first end surface TT1*bs* and the thermoelectric module 1000.

The second conductive part TT2 may include a second clamp TT2*a* surrounding the second flow path P2 and a second extension part TT2*b* extending toward the thermoelectric module 1000 from the second clamp TT2*a*. Furthermore, the second conductive part TT2 may further include a second fastening member TT2*f* for securing a coupling force between the second clamp TT2*a* and the second flow path P2.

The second clamp TT2*a* may include a second-first clamp TT2*aa* and a second-second clamp TT2*ab*. The second-first clamp TT2*aa* and the second-second clamp TT2*ab* may be members divided from the second clamp TT2*a* into the plane YZ perpendicular to the second direction (X-axis direction). Accordingly, the second-first clamp TT2*aa* may be disposed between the first flow path P1 and the second flow path P2. Alternatively, the second-first clamp TT2*aa* may be positioned adjacent to the thermoelectric module 1000 compared to the second-second clamp TT2*ab*.

The second-first clamp TT2*aa* may have an inner side surface TT2*aar* having a shape corresponding to an outer surface of the second flow path P2. Accordingly, the inner side surface TT2*aar* of the second-first clamp TT2*aa* may be in contact with one surface of the second flow path P2 and may surround one surface of the second flow path P2.

Additionally, the second-first clamp TT2*aa* may include a second-first hole TT2*aah* for coupling with the first-second clamp TT2*bb*. The second-first hole TT2*aah* may be positioned to the upper or lower portion of the second flow path P2.

The first-second clamp TT2*ab* may have an inner side surface TT2*abr* having a shape corresponding to an outer surface of the second flow path P2. Similar to the second-first clamp TT2*aa*, the inner side surface TT2*abr* of the first-second clamp TT2*ab* may be in contact with the other surface of the second flow path P2 and may surround the other surface of the second flow path P2. Accordingly, the second-first clamp TT2*aa* and the second-second hole TT2*ab* may surround the second flow path P2 while being in contact with the second flow path P2. As a result, the second-first clamp TT2*aa* and the second-second hole TT2*ab* may receive energy (e.g., temperature) from the second fluid E2 in the second flow path P2.

In addition, the first-second clamp TT2*ab* may include a first-second hole TT2*abh* for coupling with the second-first clamp TT2*aa*. The first-second hole TT2*abh* may be positioned to the upper or lower portion of the second flow path P2. The second-first hole TT2*aah* and the first-second hole TT2*abh* may be positioned to be overlapped with each other in the first direction (X-axis direction). Further, the second-first hole TT2*aah* may be disposed to the upper and lower portion of the second flow path P2 so as to be overlapped in the third direction (Z-axis direction). Similarly, the second-second hole TT2*abh* may be disposed to the upper and lower portion of the second flow path P2 and may be overlapped in the third direction (Z-axis direction).

In addition, the second fastening member TT2*f* may pass through the above-described second-first hole TT2*aah* and second-second hole TT2*abh*. Accordingly, a coupling force between the second-first clamp TT2*aa* and the second-second clamp TT2*ab* is secured, and a fastening force between the second-first clamp TT2*aa* and the second flow path P2 or between the second-second clamp TT2*ab* and the second flow path P2 may be improved. That is, since the second conductive part may be easily fastened to the second flow path P2, the ease of assembly may be improved.

Furthermore, the second-first clamp TT2*aa* and the second-second hole TT2*ab* may be made of a material with high thermal conductivity. For example, the second-first clamp TT2*aa* and the second-second hole TT2*ab* may include metal.

The second extension part TT2*b* may extend in the second direction (X-axis direction) from the second-first clamp TT2*aa*. The second extension part TT2*b* may be integrally formed with the second-first clamp TT2*aa*. For example, the second-first clamp TT2*aa* and the second extension part TT2*b* are integrally formed, and in a state in which the second-second clamp TT2*ab* is separated from the second-first clamp TT2*aa* and the second extension part TT2*b*, they may be coupled to each other through the second fastening member TT2*f*. Thus, the ease of assembly may be improved, as described above.

In addition, the second extension part TT2*b* may have a second end surface TT2*bs* facing the second conductive part TT2. The second end surface TT2*bs* may be in contact with the thermoelectric module 1000.

Further, the above-described first extension part TT1*b* and second extension part TT2*b* may be made of a thermally conductive material like the first clamp TT1*a* and the second clamp TT2*a*. For example, the first extension part TT1*b* and the second extension part TT2*b* may include metal.

As described above, the thermoelectric module 1000 may be disposed between the first conductive part TT1 and the second conductive part TT2. In addition, the thermoelectric module 1000 may include a plurality of thermoelectric elements 1300. For example, the plurality of thermoelectric elements 1300 may be connected to each other in series or parallel.

In addition, the thermoelectric module 1000 has a first heat-conducting member which may be in contact with the first conductive part TT1 and a second heat-conducting member which may be in contact with the second conductive part TT2. Accordingly, a lower substrate (e.g., the low-temperature part) of the thermoelectric element may receive heat conducted from the first conductive part TT1 by the first fluid E1 of the first flow path P1. In addition, an upper substrate (e.g., the high-temperature part) of the thermoelectric element may receive heat conducted from the second conductive part TT2 by the second fluid E2 of the second flow path P2. Accordingly, in the thermoelectric module 1000, the thermoelectric elements 1300 may generate power from a temperature difference generated between the lower substrate and the upper substrate. In this case, the generated power may be supplied to a battery part (not shown) or may be applied to drive a separate power component or system. A detailed description of the thermoelectric module 1000 will be described later.

The junction box JB according to the embodiment may be in contact with the first conductive part TT1. With this configuration, the temperature of the junction box JB may be maintained at a relatively low temperature, thereby minimizing heat generated by driving. That is, reliability may be improved.

Referring to FIGS. 3A and 3B, in the thermoelectric module 1000 according to the embodiment, a first minimum distance L1 from the thermoelectric module 1000 to the first flow path P1 may be greater than a second minimum distance L2 from the thermoelectric module 1000 to the second flow path P2.

First of all, heat conducted from the first flow path P1, which has a low-temperature, may change in temperature as it moves closer to the first end surface TT1*bs* of the first conductive part TT1. In addition, the heat conducted from the second flow path P2, which has a high-temperature, may change in temperature as it moves closer to a second end surface TT2*bs* of the second conductive part TT2. In this case, in order to improve the power generation performance of the thermoelectric elements 1300 in the thermoelectric module 1000, it is necessary to increase the temperature difference between the temperature (low temperature) of the first end surface TT1*bs* and the temperature (high temperature) of the second end surface TT2*bs* in contact with the thermoelectric module 1000.

Accordingly, according to the embodiment, since the second minimum distance L2 from the thermoelectric module 1000 to the second flow path P2 is smaller than the first minimum distance L1 from the thermoelectric module 1000 to the first flow path P1, a temperature variation between the second flow path P2 and the second end surface TT2*bs* may be less than a temperature variation between the first flow path P1 and the first end surface TT1*bs*. That is, the temperature difference between the high temperature and the low temperature provided to the thermoelectric elements 1300 of the thermoelectric module 1000 may be improved by minimizing the temperature variation of the second end surface TT2*bs*, which is a high temperature part, compared to the temperature variation of the first end surface TT1*bs*, which is a low temperature part. Therefore, power generation performance may also be improved.

Furthermore, a distance L3 from the thermoelectric module 1000 to a first center C1 of the first flow path P1 may be greater than a distance from the thermoelectric module 1000 to a second center C2 of the second flow path P2. In addition, a distance between the first-first clamp TT1*aa* and the thermoelectric module 1000 may be greater than a distance between the second-first clamp TT2*aa* and the thermoelectric module 1000. Further, a length of the first extension part TT1*b* in the first direction (X-axis direction) may be greater than a length of the second extension part TT2*b* in the second direction (X-axis direction).

In addition, the thermoelectric module 1000 may include a third sealing member SL3 disposed on an outermost side thereof. At least a portion of the third sealing member SL3 may be positioned between the first extension part TT1*b* and the second extension part TT2*b*. For example, the third sealing member SL3 is positioned between the first end surface TT1*bs* and the second end surface TT2*bs*, and may be in contact with the first end surface TT1*bs* and the second end surface TT2*bs*. Further, an outermost side surface of the third sealing member SL3 may be on the same plane as the outermost sides of the first extension part TT1*b* and the second extension part TT2*b*. Alternatively, the outermost side surface of the third sealing member SL3 may be positioned to be misaligned with the outer side surface of the first extension part TT1*b* and the outer side surface of the second extension part TT2*b*. For example, the outermost side surface of the third sealing member SL3 may be positioned inwardly with respect to the outer side surface of the first extension part TT1*b* and the outer side surface of the second extension part TT2*b*. Alternatively, the outermost side surface of the third sealing member SL3 may be positioned outwardly with respect to the outer side surface of the first extension part TT1*b* and the outer side surface of the second extension part TT2*b*.

In addition, the third sealing member SL3 may include a through hole SLH. Further, electric wires EP1 and EP2 electrically connected to the thermoelectric element may be connected to the junction box JB on the outside through the through hole SLH. Furthermore, the electric wires EP1 and EP2 may be electrically connected to a conductive wire part to be described later. In other words, the conductive wire part connected to the thermoelectric element may also pass through the second sealing member.

Furthermore, in the thermoelectric module 1000 according to the embodiment, when the center of one thermoelectric element is set to an inner side, the first sealing member SL1, the second sealing member SL2, and the third sealing member SL3 may be sequentially positioned toward the outer side. In addition, for example, the first sealing member SL1, the second sealing member SL2, and the third sealing member SL3 may be positioned to be spaced apart from each other. A detailed description of this will be explained later.

Figure 4:
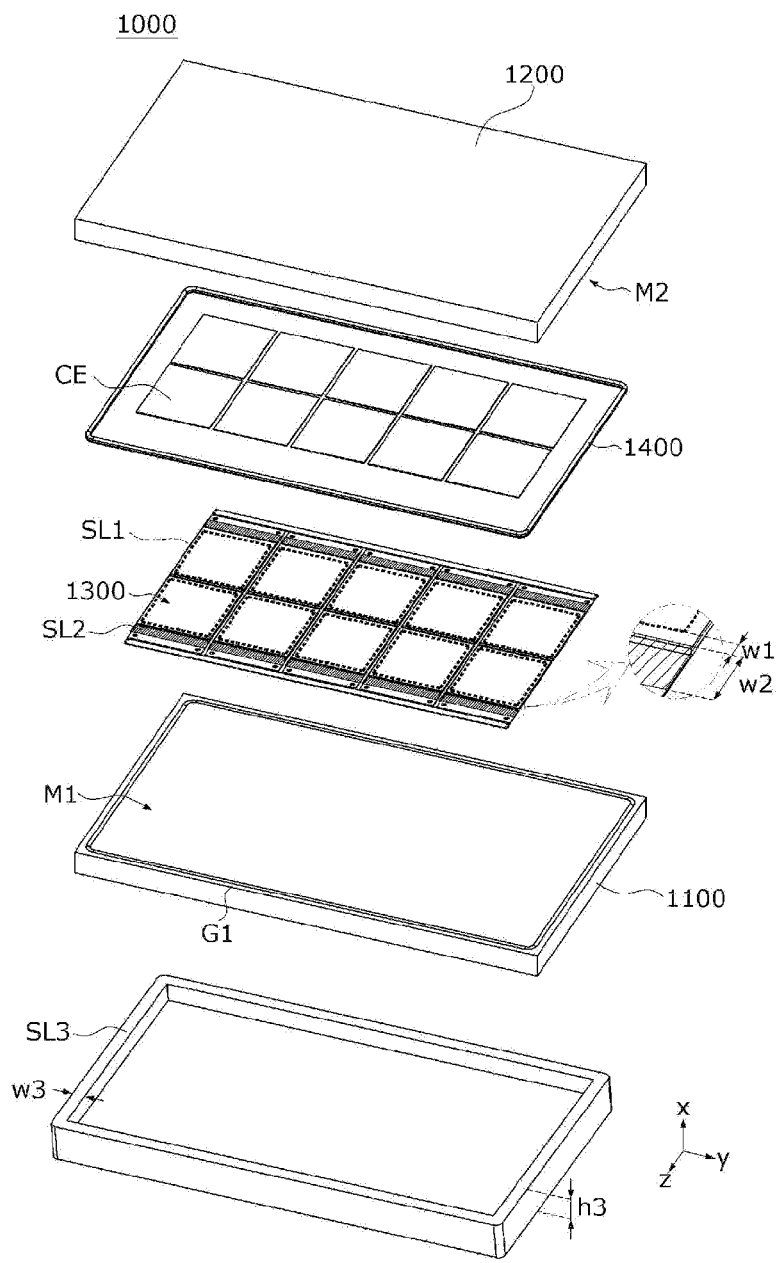
FIG. 4 is an exploded perspective view of a thermoelectric module according to an embodiment of the present disclosure.
Figure 5:
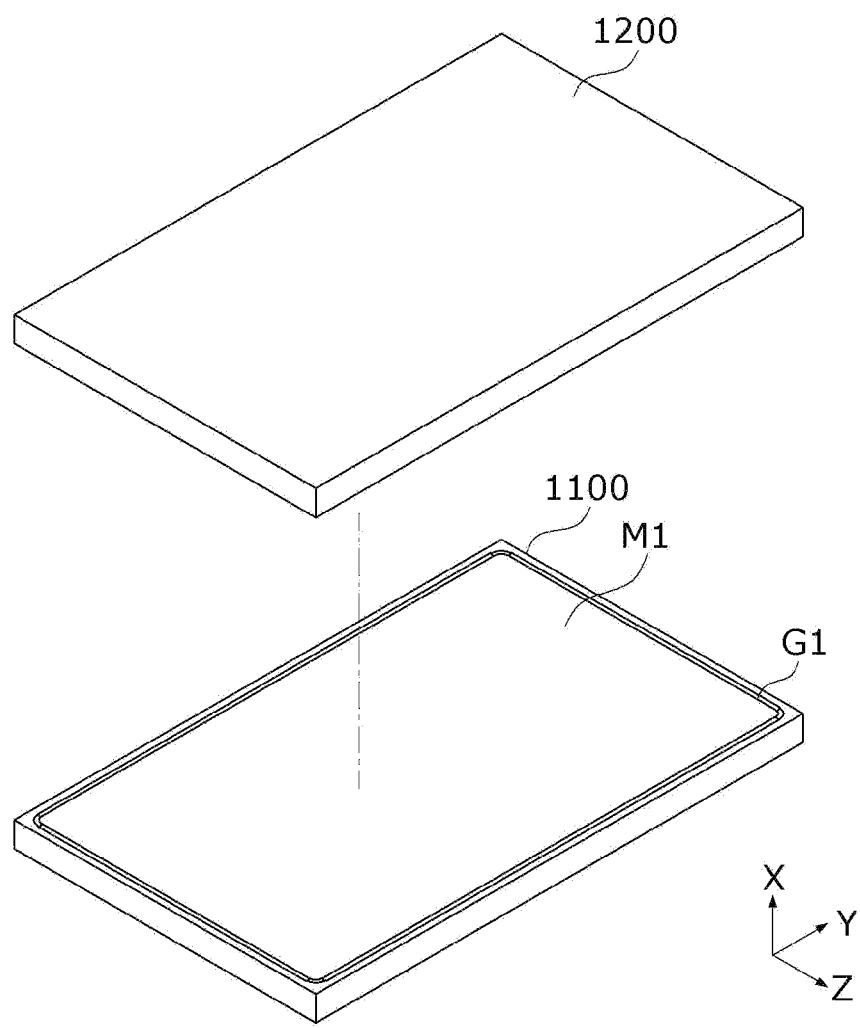
FIGS. 5 and 6 are views of a first heat-conducting member and a second heat-conducting member of a thermoelectric module according to an embodiment of the present disclosure.
Figure 6:
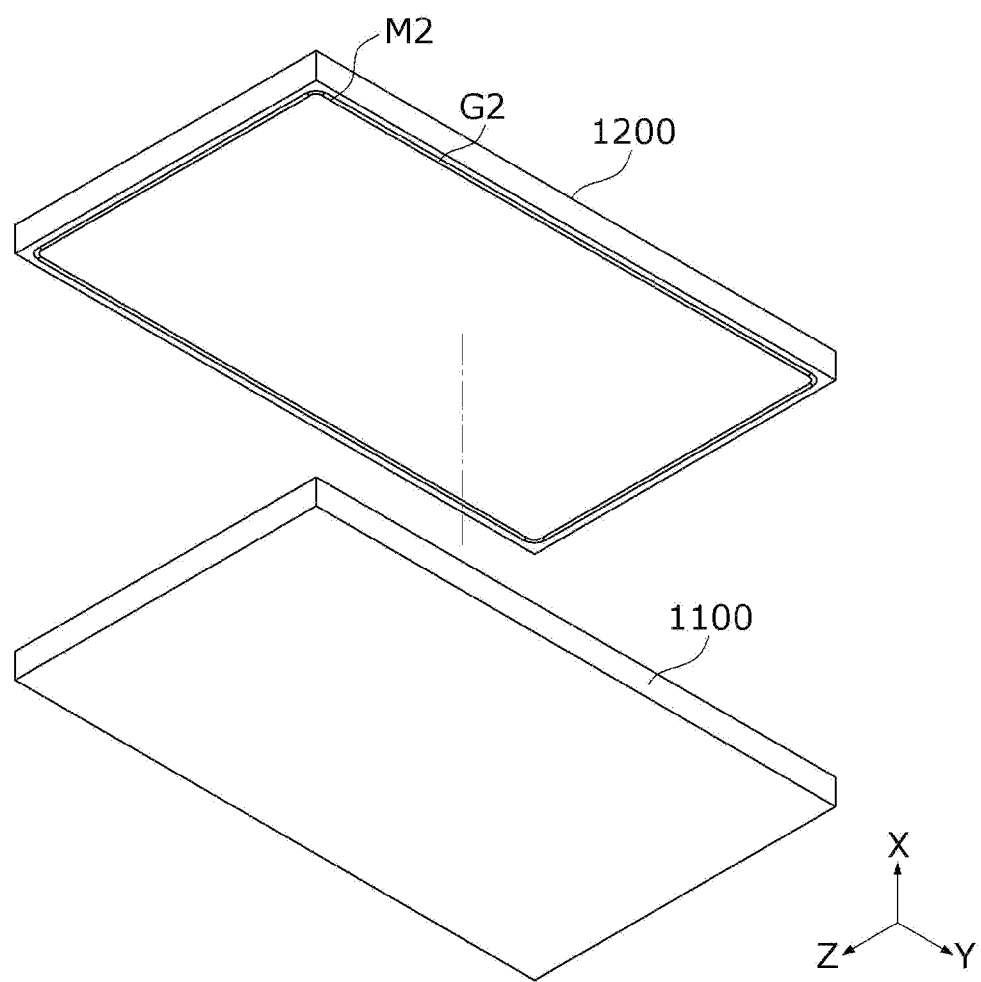

FIG. 4 is an exploded perspective view of the thermoelectric module according to the embodiment of the present disclosure, and FIGS. 5 and 6 are views of a first heat-conducting member and a second heat-conducting member of the thermoelectric module according to the embodiment of the present disclosure.

Referring to FIGS. 4 to 6, the thermoelectric module 1000 according to the embodiment of the present disclosure may include a first heat-conducting member 1100, a second heat-conducting member 1200, the thermoelectric elements 1300, a blocking member 1400, the first sealing member SL1, the second sealing member SL2 and the third sealing member SL3.

Furthermore, in the thermoelectric module 1000 according to the embodiment, the first heat-conducting member 1100 may extend from the first flow path. Alternatively, the first heat-conducting member 1100 may be in contact with the first conductive part through which heat is transferred from the first flow path. Alternatively, the first heat-conducting member 1100 may include a pipe (hereinafter referred to as a first pipe) formed therein. For example, the first pipe is connected to the first flow path so that the fluid in the first flow path may be moved. In addition, for example, the first pipe may be connected to a pipe bypassed in the first flow path. Accordingly, the fluid may be moved through the first pipe, and the fluid may transfer heat to the first heat-conducting member 1100.

Similarly, the second heat-conducting member 1200 may extend from the second flow path. Alternatively, the second heat-conducting member 1200 may be in contact with the second conductive part through which heat is transferred from the second flow path. Alternatively, the second heat-conducting member 1200 may include a pipe (hereinafter referred to as a second pipe) formed therein. For example, the second pipe is connected to the second flow path so that the fluid in the second flow path may be moved. In addition, for example, the second pipe may be connected to a pipe bypassed in the second flow path. As a result, the fluid may also be moved through the second pipe and the fluid may transfer heat to the second heat-conducting member 1200.

Accordingly, since the temperatures of the fluids flowing in the first flow path and the second flow path are different from each other, a temperature difference may occur between the first heat-conducting member 1100 and the second heat-conducting member 1200 due to a difference in thermal energy transferred from the fluids. For example, the first heat-conducting member 1100 may be a low temperature part and the second heat-conducting member 1200 may be a high temperature part. Furthermore, the first substrate of the thermoelectric element adjacent to the first heat-conducting member 1100 and conducting heat from the first heat-conducting member 1100 becomes a low-temperature part, and the second substrate of the thermoelectric element adjacent to the second heat-conducting member 1200 and conducting heat from the second heat-conducting member 1200 may be a high-temperature part. On the basis of the above, a description will be given as follows.

In addition, the first heat-conducting member 1100 may be made of a thermally conductive material. For example, the first heat-conducting member 1100 may include a metal, such as aluminum. Accordingly, the first heat-conducting member 1100 may receive heat from the first fluid flowing through the first flow path.

Further, the second heat-conducting member 1200 may be made of a thermally conductive material. For example, the second heat-conducting member 1200 may include a metal, such as aluminum. Accordingly, the second heat-conducting member 1200 may receive heat from the second fluid flowing through the second path.

In addition, the first heat-conducting member 1100 and the second heat-conducting member 1200 may be disposed to be spaced apart from each other in the first direction (X-axis direction). Further, the thermoelectric element 1300 may be disposed between the first heat-conducting member 1100 and the second heat-conducting member 1200.

The above-described circuit part and the like may be positioned in the first heat-conducting member 1100. Accordingly, since the first heat-conducting member 1100 is in a low-temperature state, heat generation of the circuit part may be suppressed by the first heat-conducting member 1100 even if heat generation occurs due to driving of the circuit part. However, it is not limited thereto, and as described above, a junction box may be disposed at the outside.

Furthermore, the first heat-conducting member 1100 may include a first edge groove G1. The first edge groove G1 may be positioned on a first surface M1 where the first heat-conducting member 1100 faces the second heat-conducting member 1200. The blocking member 1400 to be described below may be disposed in the first edge groove G1. The blocking member 1400 may be made of a heat-resistant and moisture-resistant material. For example, the blocking member 1400 may be made of rubber or the like. In addition, the first edge groove G1 may be disposed outside the thermoelectric element 1300. In the embodiment, the first edge groove G1 may be disposed along the edge of the first surface M1 of the first heat-conducting member 1100. In addition, the first edge groove G1 may have a closed loop shape in a plane YZ perpendicular to the first direction. Accordingly, the thermoelectric element 1300 may be surrounded by the blocking member 1400 through the blocking member 1400 disposed in the first edge groove G1. As a result, the thermoelectric element 1300 may be shielded by the first heat-conducting member 1100 and the second heat-conducting member 1200 as well as the blocking member 1400. For example, the first heat-conducting member 1100 may be positioned to the lower portion of the thermoelectric element 1300, the second heat-conducting member 1200 may be positioned to the upper portion of the thermoelectric element 1300, and the blocking member 1400 may be positioned to the outer side of the thermoelectric element 1300. That is, the thermoelectric element 1300 may be positioned in an inner side region formed by the first heat-conducting member 1100, the second heat-conducting member 1200 and the blocking member 1400. Accordingly, moisture resistance of the thermoelectric module according to the embodiment may be improved.

Furthermore, the second heat-conducting member 1200 may include a second edge groove G2. The second edge groove G2 may be positioned on a second surface M2 of the second heat-conducting member 1200 facing the first heat-conducting member 1100. The blocking member 1400 may be disposed in the second edge groove G2. Further, the second edge groove G2 may be disposed to face the first edge groove G1. In addition, the second edge groove G2 may be positioned to be at least partially overlapped with the first edge groove G1 in the first direction (X-axis direction). Accordingly, moisture resistance of the thermoelectric module may be improved by the blocking member 1400 applied between the first edge groove G1 and the second edge groove G2.

Similarly, the second edge groove G2 may be disposed outside the thermoelectric element 1300. In the embodiment, the second edge groove G2 may be disposed along the edge of the second surface M2 of the second heat-conducting member 1200. In addition, the second edge groove G2 may have a closed loop shape in a plane YZ perpendicular to the first direction. Accordingly, the thermoelectric element 1300 may be surrounded by the blocking member 1400.

The thermoelectric element 1300 may be disposed between the first heat-conducting member 1100 and the second heat-conducting member 1200. Further, there may be a plurality of thermoelectric elements 1300, and the plurality of thermoelectric elements 1300 may be electrically connected. For example, the plurality of thermoelectric elements 1300 may be connected to each other in series or parallel. To this end, a connection board BD for electrical connection between the thermoelectric elements may be additionally disposed on one side of the plurality of thermoelectric elements 1300.

In addition, in the thermoelectric elements 1300, one of the lower substrate (or first substrate) and the upper substrate (or second substrate) may be in contact with the first heat-conducting member 1100 and the other may be in contact with the second heat-conducting member 1200. Accordingly, the lower substrate (e.g., the low temperature part) of the thermoelectric element may receive heat conducted to the first heat-conducting member 1100 through the first flow path. In addition, the upper substrate (e.g., the high-temperature part) of the thermoelectric element may receive heat conducted to the second heat-conducting member 1200 through the second flow path. Thus, the thermoelectric element 1300 may generate power from a temperature difference generated between the lower substrate and the upper substrate. In this case, the generated power may be supplied to a battery part (not shown) or may be applied to drive a separate power component or system. A detailed description of the thermoelectric element 1300 will be explained later.

The blocking member 1400 may be disposed along an edge of the first heat-conducting member 1100 or the second heat-conducting member 1200 outside of the thermoelectric element 1300. In addition, the blocking member 1400 may be disposed between the first heat-conducting member 1100 and the second heat-conducting member 1200. For example, the blocking member 1400 may surround the thermoelectric element 1300 by being spaced a predetermined distance from the edge of the first heat-conducting member 1100 or the second heat-conducting member 1200. That is, the blocking member 1400 may be positioned outside the thermoelectric element 1300. In addition, in the embodiment, the blocking member 1400 may be positioned to the outermost side between the first heat-conducting member 1100 and the second heat-conducting member 1200. The blocking member 1400 may have a closed loop structure with respect to the plane YZ perpendicular to the first direction. As a result, it is possible to prevent external moisture and foreign substances from moving to the thermoelectric element in the blocking member 1400. That is, performance and reliability of the thermoelectric module according to the embodiment may be improved.

The blocking member 1400 may surround the thermoelectric element 1300 disposed between the first heat-conducting member 1100 and the second heat-conducting member 1200 on the plane YZ. In other words, the blocking member 1400 may be positioned in a region around the thermoelectric element 1300 on the plane YZ. Accordingly, the thermoelectric element 1300 may be overlapped with the blocking member 1400 in a second direction (Y-axis direction) or a third direction (Z-axis direction). Furthermore, since the blocking member 1400 is positioned in the first edge groove G1 and the second edge G2, the length of the blocking member 1400 in the first direction may be greater than the length of the thermoelectric element 1300 in the first direction.

As a result, the first heat-conducting member 1100 may be positioned to the lower portion of the thermoelectric element 1300, the second heat-conducting member 1200 may be positioned to the upper portion of the thermoelectric element 1300, and the blocking member 1400 may be positioned on the outer side of the thermoelectric element 1300. That is, the thermoelectric element 1300 may be positioned in an inner region formed by the first heat-conducting member 1100, the second heat-conducting member 1200 and the blocking member 1400.

And the first sealing member SL1 may be disposed between the first and second substrates of the thermoelectric element. In addition, the first sealing member SL1 may be made of a moisture resistant material. For example, the first sealing member SL1 may include at least one of an epoxy resin and a silicone resin, or may include a tape applied with at least one of an epoxy resin and a silicone resin on both sides.

The first sealing member SL1 may serve to seal between the first substrate and the second substrate. In addition, the first sealing member SL1 may be used interchangeably with a finishing material, a finishing layer, a waterproofing material, a waterproofing layer, and the like.

In addition, the second sealing member SL2 may be disposed to surround the first sealing member. In an embodiment, the second sealing member SL2 may be in contact with the outer side surface of the first substrate and the outer side surface of the second substrate. As a result, since the second sealing member SL2 surrounds the first electrode, the second electrode, the semiconductor structure, and the first sealing member therein along the outer surfaces of the first substrate and the second substrate, it is possible to prevent external foreign substances, moisture, or the like from penetrating into the inside.

Similar to the first sealing member SL1, the second sealing member SL2 may be made of a moisture-resistant material. For example, the second sealing member SL2 may include at least one of an epoxy resin and a silicone resin, or may include a tape applied with at least one of an epoxy resin and a silicone resin on both sides. In addition, the second sealing member SL2 may also be used interchangeably with a finishing material, a finishing layer, a waterproofing material, a waterproofing layer, and the like.

The third sealing member SL3 may be disposed outside the second sealing member SL2 to surround the second sealing member SL2. The third sealing member SL3 may be disposed outside the first heat-conducting member 1100, the second heat-conducting member 1200, and the thermoelectric element 1300, and may be in contact with the first heat-conducting member 1100 and the second heat-conducting member 1200. Accordingly, the third sealing member SL3 may surround the first heat-conducting member 1100, the second heat-conducting member 1200 and the thermoelectric element 1300. Thus, it is possible to prevent foreign substances, moisture, or the like from penetrating into the thermoelectric element 1300 disposed between the first heat-conducting member 1100 and the second heat-conducting member 1200.

In addition, the third sealing member SL3 may be made of a material such as moisture resistance. Further, while the first sealing member SL1 and the second sealing member SL2 are made of the same material such as epoxy or silicone, the third sealing member SL3 may be made of a material different from that of the first sealing member SL1 or the second sealing member SL2. For example, the third sealing member SL3 may be made of a urethane material. As a result, the third sealing member SL3 may be performed to maintain heat transferred to the first heat-conducting member 1100 and the second heat-conducting member 1200.

In an embodiment, the first sealing member SL1, the second sealing member SL2, and the third sealing member SL3 may be spaced apart from each other. In addition, the first sealing member SL1, the second sealing member SL2, and the third sealing member SL3 may have different heights, which are lengths in the first direction. The heights of the first sealing member SL1, the second sealing member SL2, and the third sealing member SL3 may be changed to correspond to the positions of the first sealing member SL1, the second sealing member SL2, and the third sealing member SL3. With this configuration, since each of the first sealing member SL1, the second sealing member SL2, and the third sealing member SL3 blocks penetration of foreign substances and moisture, the reliability of the thermoelectric module may be further improved. A detailed description of these positions and structures will be described later.

As another example, the first sealing member SL1 and the second sealing member SL2 may be in contact with each other, but will be described herein based on each of the first sealing member SL1, the second sealing member SL2, and the third sealing member SL3 being spaced apart from each other.

In addition, the widths of the first sealing member SL1, the second sealing member SL2, and the third sealing member SL3 may be different from each other. Here, the width may be the length in the second direction (Y-axis direction) or the third direction (Z-axis direction).

For example, the width W3 of the third sealing member SL3 may be greater than the width W2 of the second sealing member SL2. In addition, the width W2 of the second sealing member SL2 may be greater than the width W1 of the first sealing member SL1. The first sealing member SL1, the second sealing member SL2, and the third sealing member SL3 have different lengths in the first direction. That is, since their heights are different and sequentially increased, the widths may also be increased correspondingly. As a result, the first sealing member SL1, the second sealing member SL2, and the third sealing member SL3 may easily perform sealing and coupling for a configuration contacted by each. For example, since the third sealing member SL3 is in contact with the first heat-conducting member 1100 and the second heat-conducting member 1200 to surround both the first heat-conducting member 1100 and the second heat-conducting member 1200, heat dissipation and sealing of the first heat-conducting member 1100, the second heat-conducting member 1200, and the thermoelectric element 1300 may be easily performed. Furthermore, the third sealing member SL3 may also improve the coupling force between the first heat-conducting member 1100 and the second heat-conducting member 1200.

Figure 7:
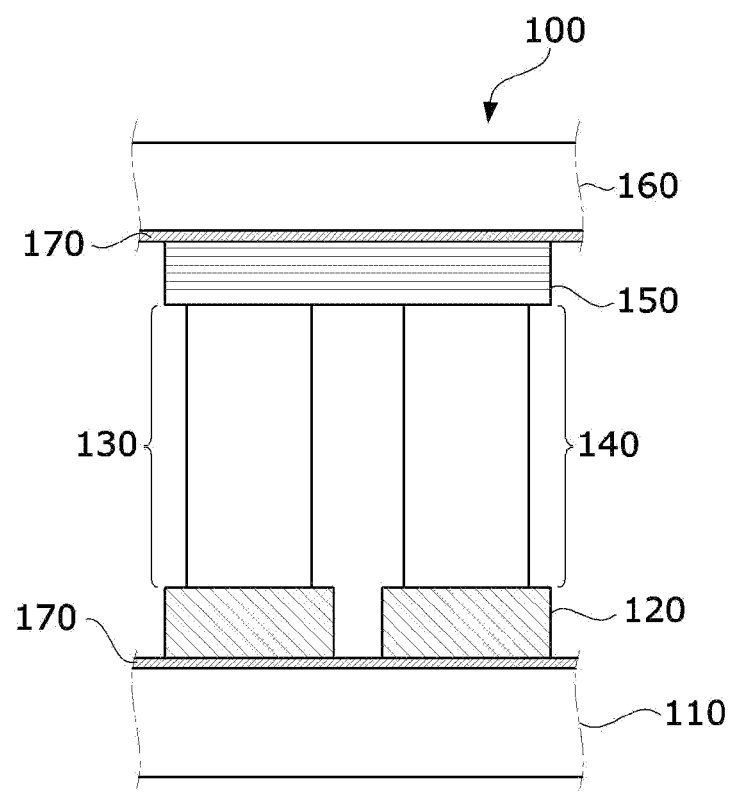
FIG. 7 is a cross-sectional view of a thermoelectric element included in a thermoelectric module according to an embodiment of the present disclosure.
Figure 8:
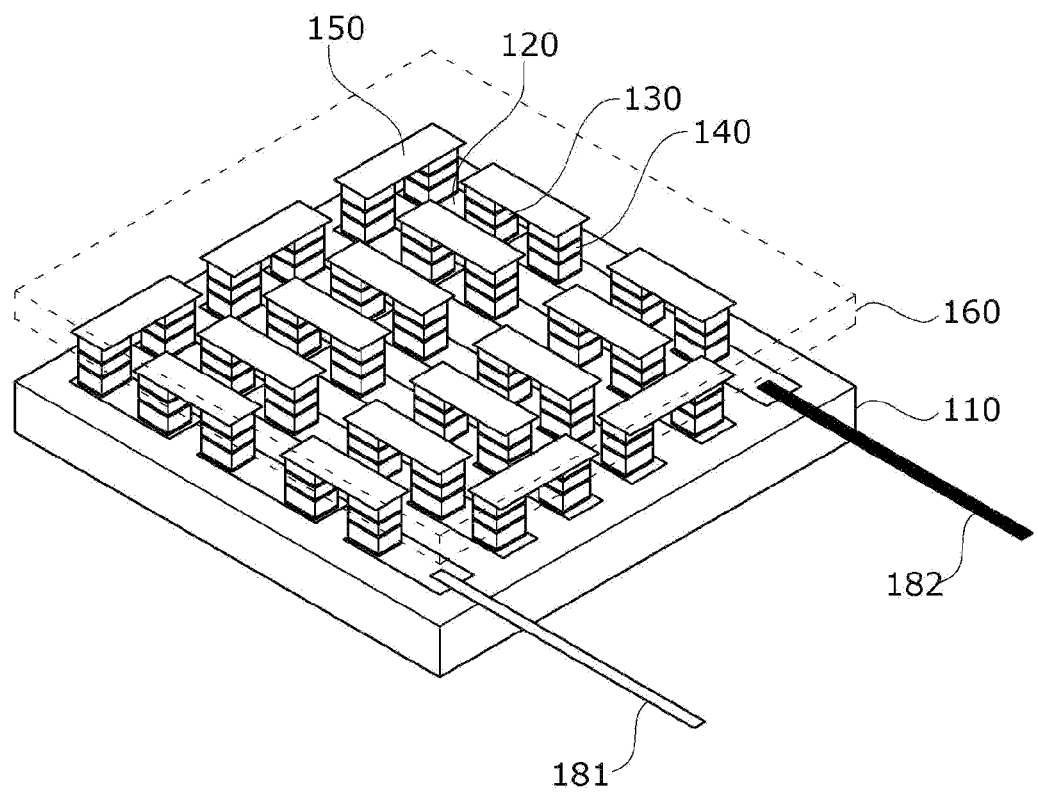
FIG. 8 is a conceptual diagram of a thermoelectric element included in a thermoelectric module according to an embodiment of the present disclosure.

FIG. 7 is a cross-sectional view of a thermoelectric element included in the thermoelectric module according to the embodiment of the present disclosure, and FIG. 8 is a conceptual diagram of the thermoelectric element included in the thermoelectric module according to the embodiment of the present disclosure.

Referring to FIGS. 7 and 8, a thermoelectric element 100 includes a lower substrate 110, lower electrodes 120, P-type thermoelectric legs 130, N-type thermoelectric legs 140, upper electrodes 150, and an upper substrate 160.

The lower electrodes 120 are disposed between the lower substrate 110 and lower bottom surfaces of the P-type thermoelectric legs 130 and the N-type thermoelectric legs 140, and the upper electrodes 150 are disposed between the upper substrate 160 and upper bottom surfaces of the P-type thermoelectric legs 130 and the N-type thermoelectric legs 140. Accordingly, a plurality of P-type thermoelectric legs 130 and a plurality of N-type thermoelectric legs 140 are electrically connected by the lower electrodes 120 and the upper electrodes 150. A pair of the P-type thermoelectric leg 130 and the N-type thermoelectric leg 140, which are disposed between the lower electrode 120 and the upper electrode 150 and electrically connected to each other, may form a unit cell.

For example, when a voltage is applied between the lower electrode 120 and the upper electrode 150 through lead wires 181 and 182, due to the Peltier effect, the substrate through which a current flows from the P-type thermoelectric leg 130 to the N-type thermoelectric leg 140 may absorb heat and thus serve as a cooling part, and the substrate through which a current flows from the N-type thermoelectric leg 140 to the P-type thermoelectric leg 130 may be heated and thus serve as a heating part. Alternatively, when a temperature difference is provided between the lower electrode 120 and the upper electrode 150, the charges in the P-type thermoelectric leg 130 and the N-type thermoelectric leg 140 are moved due to the Seebeck effect so that electricity may be produced.

Here, the P-type thermoelectric leg 130 and the N-type thermoelectric leg 140 may be bismuth-telluride (Bi—Te)-based thermoelectric legs including bismuth (Bi) and tellurium (Te) as main raw materials. The P-type thermoelectric leg 130 may be a Bi—Te-based thermoelectric leg including at least one among antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may include a Bi—Sb—Te-based main raw material in a range of 99 to 99.999 wt % and a material containing at least one among Ni, Al, Cu, Ag, Pb, B, Ga, and In in a range of 0.001 to 1 wt % based on a total weight of 100 wt %. The N-type thermoelectric leg 140 may be a Bi—Te-based thermoelectric leg including at least one among selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may include a Bi—Se—Te-based main raw material in a range of 99 to 99.999 wt % and a material containing at least one among nickel (Ni), aluminum (Al), copper (Cu), silver (Ag), lead (Pb), boron (B), gallium (Ga), and indium (In) in a range of 0.001 to 1 wt % based on a total weight of 100 wt %.

The P-type thermoelectric leg 130 and the N-type thermoelectric leg 140 may be formed as a bulk type or a stacked type. Generally, the bulk type P-type thermoelectric leg 130 or the bulk type N-type thermoelectric leg 140 may be obtained through a process of performing a thermal process on a thermoelectric material to manufacture an ingot, crushing and sieving the ingot to obtain a powder for a thermoelectric leg, sintering the powder, and cutting a sintered body. In this case, the P-type thermoelectric leg 130 and the N-type thermoelectric leg 140 may be polycrystalline thermoelectric legs. As described above, when the P-type thermoelectric leg 130 and the N-type thermoelectric leg 140 are polycrystalline thermoelectric legs, the strength of each of the P-type thermoelectric leg 130 and the N-type thermoelectric leg 140 may be increased. The stacked type P-type thermoelectric leg 130 or the stacked type N-type thermoelectric leg 140 may be obtained through a process of applying a sheet-shaped base with a paste including the thermoelectric material to form unit members, stacking the unit members, and cutting the stacked unit members.

In this case, the pairs of P-type thermoelectric leg 130 and N-type thermoelectric leg 140 may have the same shape and volume or may have different shapes and volumes. For example, since the P-type thermoelectric leg 130 and the N-type thermoelectric leg 140 have different electrical conduction properties, a height or sectional area of the N-type thermoelectric leg 140 may be formed to be different from that of the P-type thermoelectric leg 130.

Here, the P-type thermoelectric leg 130 or the N-type thermoelectric leg 140 may have a cylindrical shape, a polygonal column shape, an elliptical column shape, or the like.

Performance of the thermoelectric element according to the embodiment of the present disclosure may be represented by a figure of merit ZT. The figure of merit ZT may be expressed by Equation 1.

$$ZT = \alpha^2 \cdot \sigma \cdot T / k \qquad \text{[Equation 1]}$$

where $\alpha$ is the Seebeck coefficient [V/K], $\sigma$ is electrical conductivity [S/m], and $\alpha^2 \sigma$ is a power factor [W/mK$^2$]. In addition, T is temperature and k is a thermal conductivity [W/mK]. k may be expressed as $a \cdot cp \cdot \rho$, wherein a is thermal diffusivity [cm$^2$/S], cp is specific heat [J/gK], and $\rho$ is density [g/cm$^3$].

In order to obtain a figure of merit of a thermoelectric element, a Z value [V/K] is measured using a Z meter, and the figure of merit ZT may be calculated using the measured Z value.

Here, the lower electrode 120, which is disposed between the lower substrate 110 and the P-type thermoelectric leg 130 and the N-type thermoelectric leg 140, and the upper electrode 150, which is disposed between the upper substrate 160 and the P-type thermoelectric leg 130 and the N-type thermoelectric leg 140, may include at least one among copper (Cu), silver (Ag), aluminum (Al), and nickel (Ni) and have a thickness of 0.01 mm to 0.3 mm. When the lower electrode 120 or the upper electrode 150 has a thickness less than 0.01 mm, the function thereof as an electrode decrease and thus electrical conduction performance may be degraded, and, when the thickness thereof exceeds 0.3 mm, conduction efficiency may be degraded due to an increase in resistance.

In addition, the lower substrate 110 and the upper substrate 160 facing each other may be metal substrates and may have a thickness of 0.1 mm to 1.5 mm. When the thickness of the metal substrate is less than 0.1 mm or exceeds 1.5 mm, a heat dissipation characteristic or thermal conductivity may be excessively increased so that the reliability of the thermoelectric element may be deteriorated. In addition, when the lower substrate 110 and the upper substrate 160 are metal substrates, insulating layers 170 may be further formed between the lower substrate 110 and the lower electrodes 120 and between the upper substrate 160 and the upper electrodes 150. The insulating layer 170 may include a material having a thermal conductivity of 1 to 20 W/mK. In this case, the insulating layer 170 may be a resin composition containing at least one of an epoxy resin and a silicone resin and an inorganic material, a layer made of a silicon composite containing silicon and an inorganic material, or an aluminum oxide layer. Here, the inorganic material may be at least one of oxides, nitrides, and carbides of aluminum, boron, and silicon. A detailed description thereof will be explained later.

In this case, the lower substrate 110 and the upper substrate 160 may be formed to have different sizes. That is, the volume, the thickness, or the area of one of the lower substrate 110 and the upper substrate 160 may be formed to be greater than that of the other one thereof. Here, the thickness may be a thickness in a direction from the lower substrate 110 toward the upper substrate 160, and the area may be an area in a direction perpendicular to a direction from the substrate 110 toward the upper substrate 160. Accordingly, heat absorption performance or heat dissipation performance of the thermoelectric element may be improved. Preferably, the volume, the thickness, or the area of the lower substrate 110 may be formed to be greater than that of the upper substrate 160. Here, in a case where the lower substrate 110 is disposed in a high-temperature region for the Seebeck effect, the lower substrate 110 is applied as a heating region for the Peltier effect, or a sealing member for protecting a thermoelectric module, which will be described later, from the external environment is disposed on the lower substrate 110, at least one of the volume, the thickness, or the area of the lower substrate 110 may be greater than that of the upper substrate 160. In this case, the area of the lower substrate 110 may be formed in a range of 1.2 to 5 times the area of the upper substrate 160. When the area of the lower substrate 110 is formed to be less than 1.2 times that of the upper substrate 160, the effect on improving heat transfer efficiency is not great, and when the area of the lower substrate 110 is formed to be more than 5 times that of the upper substrate 160, the heat transfer efficiency is significantly reduced, and the basic shape of the thermoelectric module may be difficult to maintain.

In addition, a heat dissipation pattern, for example, an irregular pattern, may be formed on a surface of at least one of the lower substrate 110 and the upper substrate 160. Accordingly, the heat dissipation performance of the thermoelectric element may be improved. In a case in which the irregular pattern is formed on a surface in contact with the P-type thermoelectric leg 130 or N-type thermoelectric leg 140, a bonding property between the thermoelectric leg and the substrate may also be improved. The thermoelectric element 100 includes the lower substrate 110, the lower electrodes 120, the P-type thermoelectric legs 130, the N-type thermoelectric legs 140, the upper electrodes 150, and the upper substrate 160.

Although not shown, a first sealing member may be further disposed between the lower substrate 110 and the upper substrate 160. Accordingly, the lower electrodes 120, the P-type thermoelectric legs 130, the N-type thermoelectric legs 140, and the upper electrodes 150 may be sealed from external moisture, heat, contamination, and the like.

Figure 9:
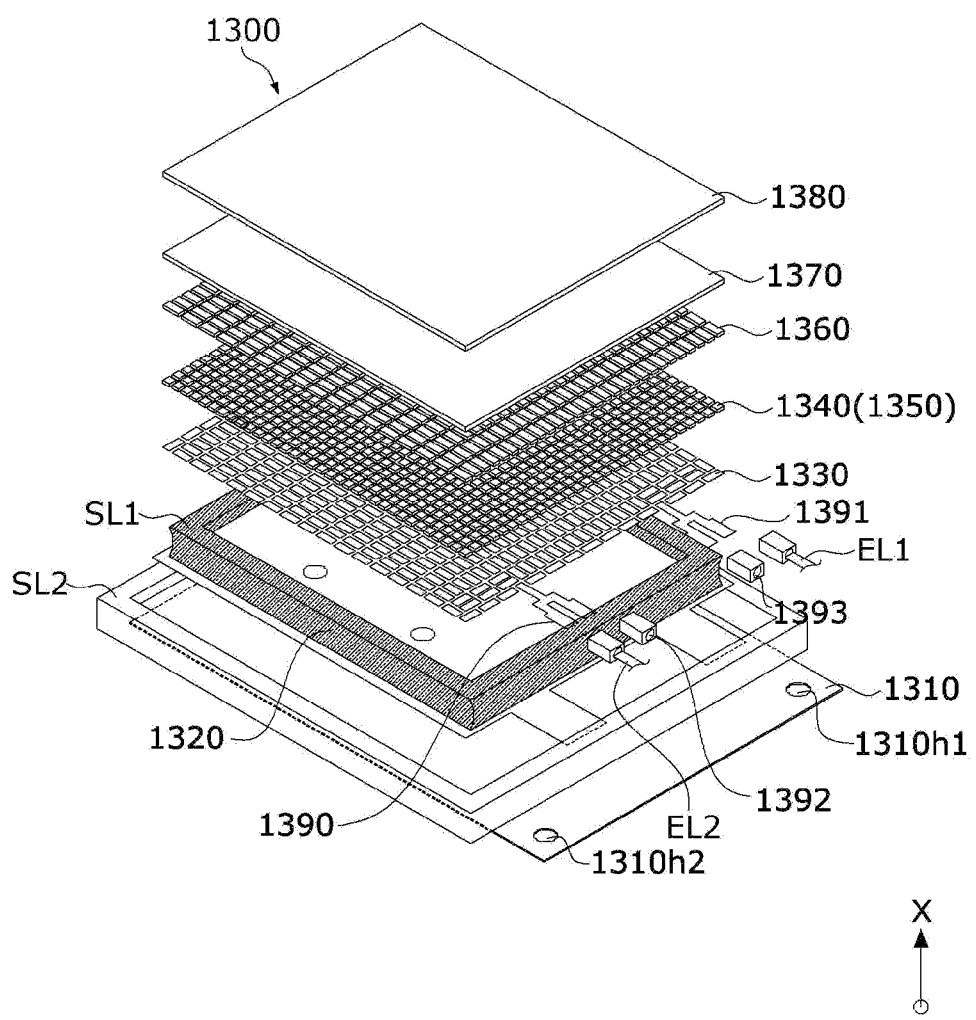
FIG. 9 is an exploded perspective view of a thermoelectric element, a first sealing member, and a second sealing member according to an embodiment of the present disclosure.
Figure 10:
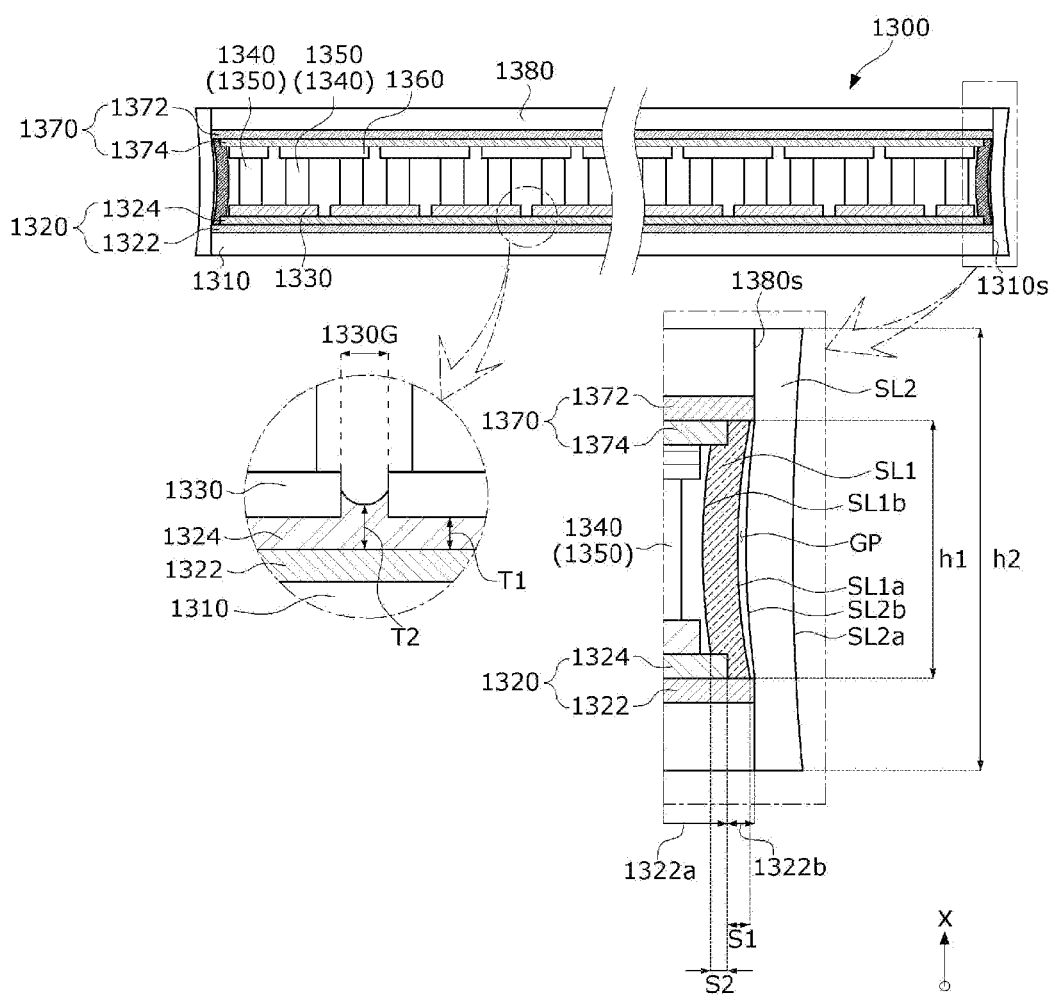
FIG. 10 is a cross-sectional view of a thermoelectric element, a first sealing member, and a second sealing member according to an embodiment of the present disclosure.

FIG. 9 is an exploded perspective view of a thermoelectric element according to the embodiment of the present disclosure, and FIG. 10 is a cross-sectional view of a thermoelectric element, a first sealing member, and a second sealing member according to an embodiment of the present disclosure.

Referring to FIGS. 9 and 10, a thermoelectric element 1300 according to an embodiment of the present disclosure may include a first substrate 1310, a lower insulating layer 1320 disposed on the first substrate 1310, a plurality of first electrodes 1330 disposed on the lower insulating layer 1320, a plurality of semiconductor structures 1340 and 1350 disposed on the plurality of first electrodes 1330, a plurality of second electrodes 1360 disposed on the semiconductor structures, an upper insulating layer 1370 disposed on the plurality of second electrodes 1360, and a second substrate 1380 disposed on the upper insulating layer 1370.

In addition, the lower insulating layer 1320 may include a first insulating layer 1322 disposed on the first substrate 1310 and a second insulating layer 1324 disposed on the first insulating layer 1322.

Further, the semiconductor structures 1340 and 1350 may include a first semiconductor structure 1340 and a second semiconductor structure 1350. In addition, the first semiconductor structure 1340 may correspond to one of the N-type thermoelectric leg and the P-type thermoelectric leg, and the second semiconductor structure 1350 may correspond to the other one. Furthermore, there may be a plurality of first semiconductor structures 1340 and a plurality of second semiconductor structures 1350.

In addition, the upper insulating layer 1370 may include a third insulating layer 1372 disposed below the second substrate 1380 and a fourth insulating layer 1374 disposed below the third insulating layer 1372. The fourth insulating layer 1374 may be positioned between the third insulating layer 1372 and the second electrode 1360.

Further, the first electrode 1330 and the second electrode 1360 may correspond to the lower electrode 120 and the upper electrode 150 described with reference to FIGS. 7 and 8, respectively. In addition, since the first substrate 1310 corresponds to the lower substrate 110, the second substrate 1380 corresponds to the upper substrate 160, and the lower insulating layer 1320 and the upper insulating layer 1370 correspond to the insulating layer 170, the corresponding components may be applied identically or similarly to those described in FIGS. 7 and 8 except for those described below.

In addition, at least one of the first substrate 1310 and the second substrate 1380 may be a metal substrate. For example, at least one of the first substrate 1310 and the second substrate 1380 may be made of at least one of aluminum, an aluminum alloy, copper, and a copper alloy. The first substrate 1310 and the second substrate 1380 may be made of different materials. For example, of the first substrate 1310 and the second substrate 1380, a substrate requiring more withstand voltage performance may be made of an aluminum substrate, and a substrate requiring more heat-conducting performance may be made of a copper substrate.

In addition, since power is connected to an electrode disposed on the low-temperature part of the thermoelectric element 1300, higher withstand voltage performance may be required in the low-temperature part compared to the high-temperature part. In contrast, when the thermoelectric element 1300 is driven, the high-temperature part of the thermoelectric element 1300 may be exposed to a high temperature, for example, about 180° C. or higher, and delamination between the electrodes, the insulating layers and the substrate may be a problem due to the different coefficients of thermal expansion of the electrode, the insulating layer and the substrate. Accordingly, the high-temperature part of the thermoelectric element 1300 may require higher thermal shock mitigation performance compared to the low-temperature part. Thus, the structure of the high-temperature part and the structure of the low-temperature part may be different.

Hereinafter, the connection of the electrode connection parts 1390 and 1391 to the first electrodes 1330 disposed on the first substrate 1310 will be described with reference to FIG. 9.

As described above, the lower insulating layer 1320 may be disposed on the first substrate 1310 and the plurality of first electrodes 1330 may be disposed on the lower insulating layer 1320.

In addition, the electrode connection parts 1390 and 1391 may include or be connected to a first connection unit 1392 and a second connection unit 1393 having different polarities. For example, when a (−) terminal is connected to the first connection unit 1392, a (+) terminal may be connected to the second connection unit 1393. For example, the first connection unit 1392 of the electrode connection parts 1390 and 1391 may connect one of the plurality of first electrodes 1330 to the (−) terminal, and the second connection unit 1393 may connect another one of the plurality of first electrodes 1330 to the (−) terminal. Accordingly, the positions of the electrode connection parts 1390 and 1391 may affect the insulation resistance of the thermoelectric element 1300. In addition, the first connection unit 1392 and the second connection unit 1393 are made of a plurality of numbers, such that they may be connected to electric wires or the like when the thermoelectric elements are connected in series or in parallel. As a result, the thermoelectric module may be easily changed in an electrical connection relationship (e.g., series or parallel). In addition, the insulation resistance refers to electrical resistance exhibited by an insulator when a predetermined voltage is applied, and it is necessary that the thermoelectric element 1300 satisfies a predetermined insulation resistance.

According to an embodiment, the electrode connection parts 1390 and 1391 may extend to one side on the first substrate 1310. In addition, the electrode connection parts 1390 and 1391 may be drawn out of the first sealing member, which is disposed to surround the lower insulating layer 1320, the plurality of first electrodes 1330, the plurality of first semiconductor structures 1340, and the plurality of second semiconductor structures 1350, and the plurality of second electrodes 1360 and the upper insulating layer 1370 between the first substrate 1310 and the second substrate 1380.

In addition, each of the first connection unit 1392 and the second connection unit 1393 may be a connector into which the conductive wire parts EL1 and EL2 are detachably inserted. As described above, each of the electrode connection parts 1390 and 1391, the first connection unit 1392, and the second connection unit 1393 may be disposed outside the first sealing member and inside the second sealing member. Further, the conductive wire parts EL1 and EL2 may extend outside the thermoelectric element and pass through the second sealing member SL2 to be electrically connected to the above-described external wire. Accordingly, an electrical connection may be made between the circuit part in the junction box and the thermoelectric element or thermoelectric module. However, the first sealing member SL1 may be positioned to the inner sides of the electrode connection parts 1390 and 391 or the conductive wire parts EL1 and EL2 to surround the inner semiconductor structures 1340 and 1350.

In addition, each of the first connection unit 1392 and the second connection unit 1393 may be sealed with a resin containing silicon. Accordingly, the insulation resistance and withstand voltage performance of the thermoelectric element may be further improved.

In addition, the lower insulating layer 1320 may be disposed below the plurality of first electrodes 1330 and the electrode connection parts 1390 and 1391 on the first substrate 1310, and may have an area larger than that of the first electrode 1330 and the electrode connection parts 1390 and 1391. Accordingly, the first electrode 1330 and the electrode connection parts 1390 and 1391 may be overlapped with the lower insulating layer 1320 in a vertical direction (X-axis direction).

The area of the lower insulating layer 1320 may be larger than that of the upper insulating layer 1370. Accordingly, a portion of the lower insulating layer 1320 may be overlapped with the upper insulating layer 1370 in a vertical direction (X-axis direction).

In the lower insulating layer 1320, the first insulating layer 1322 may include a composite containing silicon and aluminum. Here, the composite may be an organic/inorganic composite composed of an inorganic substance containing Si and Al elements and an alkyl chain, and may be at least one of an oxide, a carbide, and a nitride containing silicon and aluminum. For example, the composite may include at least one among an Al—Si bond, an Al—O—Si bond, a Si—O bond, an Al—Si—O bond, and an Al—O bond. The composite containing at least one among the Al—Si bond, the Al—O—Si bond, the Si—O bond, the Al—Si—O bond, and the Al—O bond as described above has an excellent insulating performance and thus may achieve high withstand voltage performance. Alternatively, the composite may be an oxide, a carbide, or a nitride further including titanium, zirconium, boron, zinc, and the like together with silicon and aluminum. To this end, the composite may be obtained through a process of mixing aluminum with at least one of an inorganic binder and an organic-inorganic hybrid binder and then heat-treating. The inorganic binder may include at least one among, for example, silica (SiO2), metal alkoxide, boron oxide (B2O3), and zinc oxide (ZnO2). The inorganic binder may be inorganic particles and may act as a binder by being solated or gelled when being in contact with water. In this case, at least one of the silica (SiO2), the metal alkoxide, and the boron oxide (B2O3) may serve to increase the adhesion between aluminum, or the adhesion to the first substrate 1310, and the zinc oxide (ZnO2) may serve to increase the strength of the first insulating layer 1322 and increase the thermal conductivity.

Meanwhile, the second insulating layer 1324 may be formed of a resin layer including at least one of an epoxy resin composition containing an epoxy resin and an inorganic filler and a silicone resin composition containing polydimethylsiloxane (PDMS). Accordingly, the second insulating layer 1324 may improve an insulation property, a bonding force, and heat-conducting performance between the first insulating layer 1322 and the first electrode 1330.

Here, the inorganic filler may be included in an amount of 60 to 80 wt % of the resin layer. When the inorganic filler is included in an amount of less than 60 wt %, the heat-conducting effect may be reduced, and when the inorganic filler is included in an amount of more than 80 wt %, the inorganic filler may be difficult to uniformly disperse in the resin and the resin layer may be easily broken.

In addition, the epoxy resin may include an epoxy compound and a curing agent. In this case, the curing agent may be included in a volume ratio of 1 to 10 with respect to a volume ratio of 10 of the epoxy compound. Here, the epoxy compound may include at least one among a crystalline epoxy compound, an amorphous epoxy compound, and a silicone epoxy compound. The inorganic filler may include at least one of aluminum oxide and nitride. Here, the nitride may include at least one of boron nitride and aluminum nitride.

When the second insulating layer 1324 is a resin composition containing PDMS resin and aluminum oxide, the content (e.g., weight ratio) of silicon in the first insulating layer 1322 may be greater than that of silicon in the second insulating layer 1324, and the content of aluminum in the second insulating layer 1324 may be greater than that of aluminum in the first insulating layer 1322. Accordingly, the silicon in the first insulating layer 1322 may mainly contribute to the improvement of the withstand voltage performance, and the aluminum oxide in the second insulating layer 1324 may mainly contribute to the improvement of the heat-conducting performance. Thus, although both the first insulating layer 1322 and the second insulating layer 1324 have the insulating performance and the heat-conducting performance, the withstand voltage performance of the first insulating layer 1322 may be higher than that of the second insulating layer 1324, and the heat-conducting performance of the second insulating layer 1324 may be higher than that of the first insulating layer 1322.

Meanwhile, the second insulating layer 1324 may be formed through a method of applying the first insulating layer 1322 with a resin composition in a non-cured state or a semi-cured state and then disposing a plurality of pre-aligned first electrodes 1330 followed by pressurizing. Accordingly, a portion of side surfaces of the plurality of first electrodes 1330 may be buried in the second insulating layer 1324.

In addition, the second insulating layer 1324 may have a variation in thickness corresponding to the first electrode 1330. In an embodiment, the second insulating layer 1324 may include a concave portion on an upper surface thereof toward the second substrate 1380 and may be concave to each other in a direction perpendicular to the concave portion toward the outside of the first sealing member SL1. For example, the second insulating layer 1324 may have a first thickness T1 and a second thickness T2 that may be different from each other, where the first thickness T1 is a thickness in a region which is overlapped with the first electrodes 1330 in the vertical direction (or the first direction), and the second thickness T2 is a thickness in a region 1330g between adjacent first electrodes 1330. The first thickness T1 in the region which is overlapped with the first electrodes 1330 in the vertical direction (or the first direction) may be smaller than the second thickness T2 in the region 1330g between adjacent first electrodes 1330. With this configuration, the coupling force between the second insulating layer 1324 and the first electrode 1330 may be improved, and an electrical short between adjacent first electrodes 1330 may be prevented. In addition, the contact area between the first electrode 1330 and the second insulating layer 1324 is increased, such that the heat transfer performance through the first electrode 1330 and the second insulating layer 1324 may also be improved.

In addition, the upper surface of the second insulating layer 1324 in the region 1330g between the adjacent first electrodes 1330 may be convex downwardly, that is, toward the first insulating layer 1322. Alternatively, the upper surface of the second insulating layer 1324 in the region 1330g between adjacent first electrodes 1330 may be concave upwardly, that is, toward the first electrode 1330. That is, the second insulating layer 1324 may include a convex portion having the upper surface which is convex toward the first substrate 1310. Here, the convex portion may be the same as the concave portion of the second insulating layer 1324 described above. Thus, the convex portion of the second insulating layer 1324 may be convex in a direction perpendicular to the convex portion toward the inside of the first sealing member SL1.

This description may be equally applied to the upper insulating layer 1370 as well. That is, the fourth insulating layer 1374 may have a variation in thickness corresponding to the second electrode 1360. For example, the fourth insulating layer 1374 may have a third thickness and a fourth thickness, that may be different from each other, where the third thickness is a thickness in a region which is overlapped with the second electrodes 1360 in the vertical direction (or the first direction), and the fourth thickness is a thickness in a region between adjacent second electrodes 1360. The third thickness in the region which is overlapped with the second electrodes 1360 in the vertical direction (or the first direction) may be smaller than the fourth thickness the region between adjacent second electrodes 1360. With this configuration, the coupling force between the fourth insulating layer 1374 and the second electrode 1360 may be improved, and an electrical short between adjacent second electrodes 1360 may be prevented. In addition, the contact area between the second electrode 1360 and the fourth insulating layer 1374 is increased, such that the heat transfer performance through the second electrode 1360 and the fourth insulating layer 1374 may also be improved.

In addition, the lower surface of the fourth insulating layer 1374 in the region between the adjacent second electrodes 1360 may be concave downwardly, that is, toward the second insulating layer 1360. Alternatively, the lower surface of the fourth insulating layer 1374 in the region between the adjacent second electrodes 1360 may be convex upwardly, that is, toward the third electrode 1372.

The upper insulating layer 1370 may be disposed between the second electrode 1360 and the second substrate 1380. In the upper insulating layer 1370, the third insulating layer 1372 may be applied as described for the first insulating layer 1322, and the fourth insulating layer 1374 may also be applied as described for the second insulating layer 1324.

In addition, an area of the upper insulating layer 1370 may be greater than the total area of the plurality of second electrodes 1360. Accordingly, the plurality of second electrodes 1360 may be overlapped with the upper insulating layer 1370 in a vertical direction (X-axis direction).

Further, the plurality of second electrodes 1360 may be disposed to face the plurality of first electrodes 1330 with the plurality of first semiconductor structures 1340 and the plurality of second semiconductor structures 1350 interposed therebetween. The plurality of first electrodes 1330 and the plurality of second electrodes 1360 may be electrically connected through the plurality of first semiconductor structures 1340 and the plurality of second semiconductor structures 1350. For example, the plurality of first electrodes 1330 and the plurality of second electrodes 1360 may be connected in series.

In addition, each of the plurality of second electrodes 1360 may be arranged in the same shape at the lower portion of the second substrate 1380 or the upper insulating layer 1370.

Furthermore, the first substrate 1310 may include a substrate hole positioned outside the lower insulating layer 1320. The substrate hole may include a first substrate hole 1310$h$1 and a second substrate hole 1310$h$2. The thermoelectric element 1300 or the first substrate 1310 may be fastened to the first heat-conducting member 1100 by screws or the like through the first substrate hole 1310*h*1 and the second substrate hole 1310*h*2.

In addition, the first sealing member SL1 may include a first region S1 in contact with the first insulating layer 1322 and a second region S2 in contact with the second insulating layer 1324. That is, the first region Si is a surface where the first sealing member SL1 is in contact with the first insulating layer 1322 and may be overlapped with the second insulating layer 1324 in the first direction (X-axis direction). And the second region S2 is a surface where the first sealing member SL1 is in contact with the second insulating layer 1324 and may be overlapped with the second insulating layer 1324 in a first direction (X-axis direction).

Further, the first insulating layer 1322 may include a first insulating portion 1322*a* which is vertically overlapped with the second insulating layer 1324 and a second insulating portion 1322*b* which is not vertically overlapped with the second insulating layer 1324.

In an embodiment, the first sealing member SL1 may be positioned between the lower insulating layer 1320 and the upper insulating layer 1370 between the first substrate 1310 and the second substrate 1380.

In addition, the first region Si of the first sealing member SL1 may be positioned in the second insulating portion 1322*b*, and the second region S2 of the first sealing member SL1 may be positioned in the first insulating portion 1322*a*. Accordingly, the first sealing member SL1 may be in contact with the first insulating layer 1322 and the second insulating layer 1324. As a result, all moisture or foreign substances passing through the first insulating layer 1322 or the second insulating layer 1324 may be blocked, and may be in contact with both the first insulating layer 1322 and the second insulating layer 1324 so that bonding force between the lower insulating layers 1320 may be improved.

In addition, the description of the first insulating layer 1322 may also be applied to the third insulating layer 1372, and the description of the second insulating layer 1324 may also be applied to the fourth insulating layer 1374.

In another embodiment, the first sealing member SL1 may be in contact with the first insulating layer 1322 and at least one of the third insulating layer 1372 and the fourth insulating layer 1374 to be positioned between the first insulating layer 1322 and at least one of the above.

In addition, as a modified example, the first sealing member SL1 may be in contact with at least one of the first insulating layer 13322 and the second insulating layer 1324 and the third insulating layer 1372 to be positioned between at least one of the above and the third insulating layer 1372.

In addition, the first sealing member SL1 may be positioned along an edge of the first substrate 1310 or the second substrate 1380 in the thermoelectric element 1300. The first sealing member SL1 may have a closed loop shape on a plane YZ perpendicular to the first direction (X-axis direction). Accordingly, the first sealing member SL1 may surround the first electrode 1330, the semiconductor structures 1340 and 1350, and the second electrode 1360. In other words, since the first electrode 1330, the semiconductor structures 1340 and 1350, and the second electrode 1360 are sealed by the lower insulating layer 1320 disposed on the lower portion, and the upper insulating layer 1370 and the first sealing member SL1 disposed on the upper portion, it is possible to prevent external foreign substances, moisture, or the like from penetrating into the inside.

Furthermore, the first sealing member SL1 according to the embodiment may have an inwardly convex structure between the lower insulating layer 1320 and the upper insulating layer 1370. Accordingly, the outer side surface SL1*a* of the first sealing member SL1 may have a curvature toward the inner semiconductor structure. For example, on the outer side surface of the first sealing member SL1, the center of the outer side surface (for example, at the point of bisecting in the vertical direction) may be positioned at an inner side surface than a point where the outer side surface is in contact with the lower insulating layer 1320 or the upper insulating layer 1370. That is, the center of the outer side surface may be positioned closer to the semiconductor structure than both ends (a point which is in contact with the lower insulating layer or the upper insulating layer) of the outer side surface. The first sealing member SL1 may have an outwardly concave structure.

Accordingly, the second sealing member SL2 surrounding the first sealing member SL1 may be spaced apart from the first sealing member SL1 while being in contact with the outer side surface 1310*s* of the first substrate 1310 and the outer side surface 1380*s* of the second substrate 1380. For example, the second sealing member SL2 may be disposed to extend from the outer side surface 1310*s* of the first substrate 1310 to the outer side surface of the second substrate 1380. Accordingly, the first sealing member SL1 may not press the second sealing member SL2 outwardly. Additionally, separation between the second sealing member SL2 and the first substrate 1310 or between the second sealing member SL2 and the second substrate 1380 may be prevented.

The second sealing member SL2 may be disposed outside the first sealing member SL1 to be in contact with the outer side surface 1310*s* of the first substrate 1310 and the outer side surface 1380*s* of the second substrate 1380. The second sealing member SL2 may also have a closed loop structure with a plane perpendicular to the first direction. In addition, the second sealing member SL2 may be positioned to surround the first sealing member SL1, at least a portion of the first substrate 1310, the lower insulating layer 1320, the first electrode 1330, the semiconductor structures 1340 and 1350, the second electrode 1360, the upper insulating layer 1370, and the second substrate 1380. As a result, the first electrode 1330, the semiconductor structures 1340 and 1350, the second electrode 1360, the upper insulating layer 1370, and the first sealing member SL1 may be sealed by the first substrate 1310 of the lower portion, the second substrate 1380 of the upper portion, and the second sealing member SL2. That is, the second sealing member SL2 may additionally shield the lower insulating layer, the upper insulating layer, and the first sealing member SL1 in addition to the components shielded by the first sealing member SL1. Accordingly, the moisture resistance of the thermoelectric module may be further improved. This makes it easy to prevent moisture or other foreign substances generated by heat from a heat transfer pipe located in a basement or the like from entering the thermoelectric module. In addition, similar to the first sealing member SL1, the outer side surface SL2*a* of the second sealing member SL2 may have a curvature toward the inner semiconductor structure or the first sealing member SL1. For example, the second sealing member SL2 may have a structure which is convex toward the inside or concave toward the outside. Similarly, the inner side surface SL2*b* of the second sealing member SL2 may also have a structure which is convex toward the inside or concave toward the outside like the inner side surface SL1*b* of the first sealing member SL1. Alternatively, either of the first sealing member SL1 or the second sealing member SL2 may be convex outwardly.

In addition, the thermoelectric module 1000 according to the embodiment may include a gap GP disposed between the first sealing member SL1 and the second sealing member SL2. That is, as the outer side surface SL1*a* of the first sealing member SL1 and the inner side surface SL2*b* of the second sealing member SL2 are spaced apart from each other, the gap GP may be positioned between the first sealing member SL1 and the second sealing member SL2. The gap GP may be a spaced space between the first sealing member SL1 and the second sealing member SL2. A fluid (including liquid, gas, etc.) may exist in the void GP, which is such a space. For example, the gap GP may be filled with air. Alternatively, the gap GP may be in a vacuum state. As such, it should be understood that the first sealing member SL1 and the second sealing member SL2 may be spaced apart and form a predetermined space. Heat dissipation may thereby be facilitated. With this configuration, even if distortion occurs due to a difference in coefficient of thermal expansion between the components in the thermoelectric module, the second sealing member is disposed outside the concave outer side surface of the first sealing member, thereby suppressing moisture permeation from the outside. Furthermore, the gap between the first sealing member and the second sealing member suppresses deformation and cracks due to thermal expansion, so that external moisture or contaminants may be effectively prevented from penetrating into the thermoelectric element. In addition, even if the first sealing member SL1 and the second sealing member SL2 are in contact with each other, the aforementioned gap GP may exist.

Further, air or the like positioned in the gap GP may be in contact with the lower insulating layer 1320 or the upper insulating layer 1370.

In addition, as described above, the first sealing member SL1 is in contact with the upper insulating layer and the lower insulating layer and is positioned between the upper insulating layer and the lower insulating layer or between the first substrate and the second substrate, and the second sealing member SL2 is in contact with the outer side surface of the first substrate and the outer side surface of the second substrate. Accordingly, the height of the first sealing member SL1 may be smaller than that of the second sealing member S12.

Figure 11:
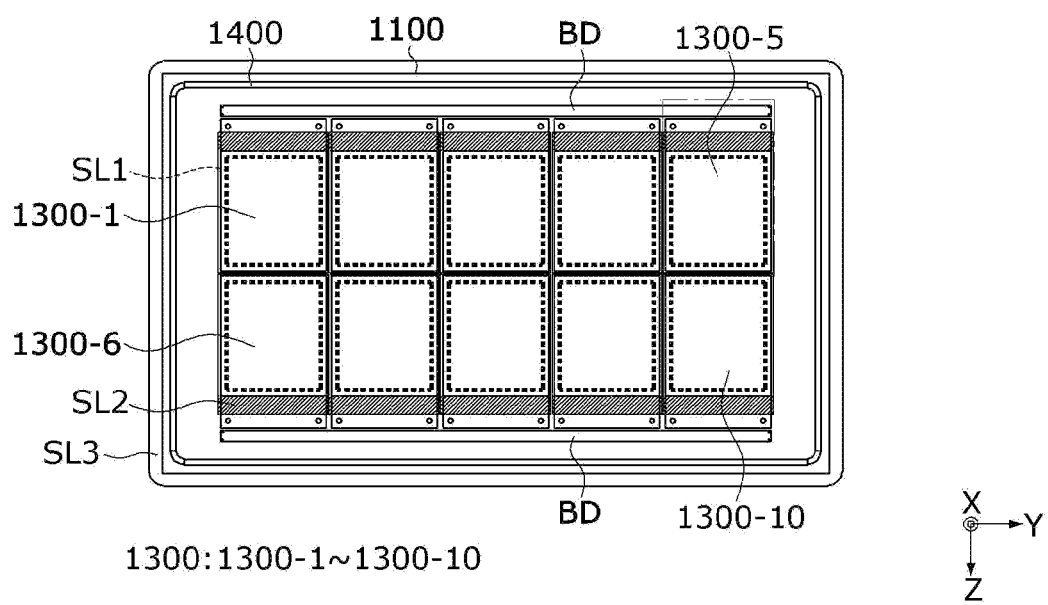
FIG. 11 is a view in which a second heat-conducting member is removed from a thermoelectric module according to an embodiment of the present disclosure.
Figure 12:
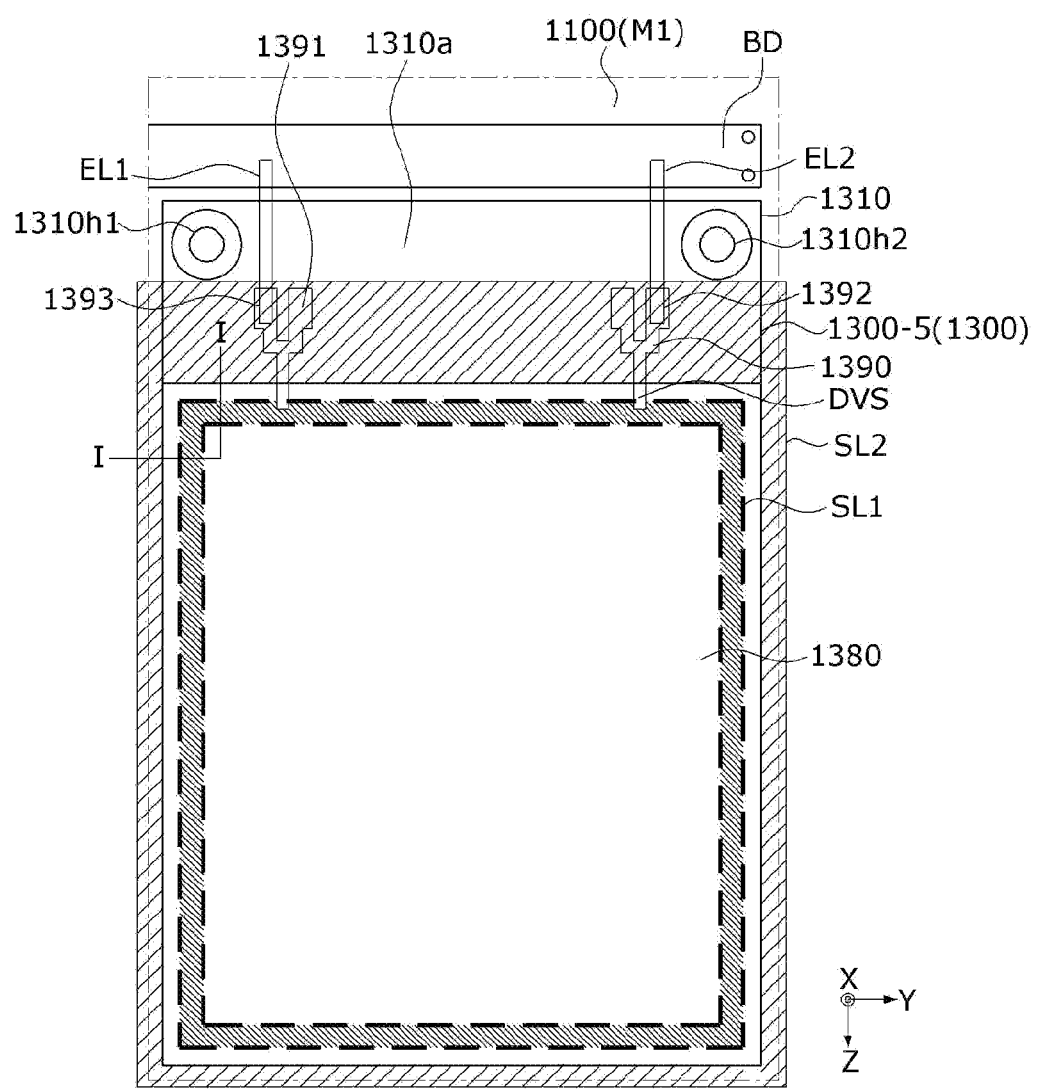
FIG. 12 is an enlarged view of the part K in FIG. 11.
Figure 13:
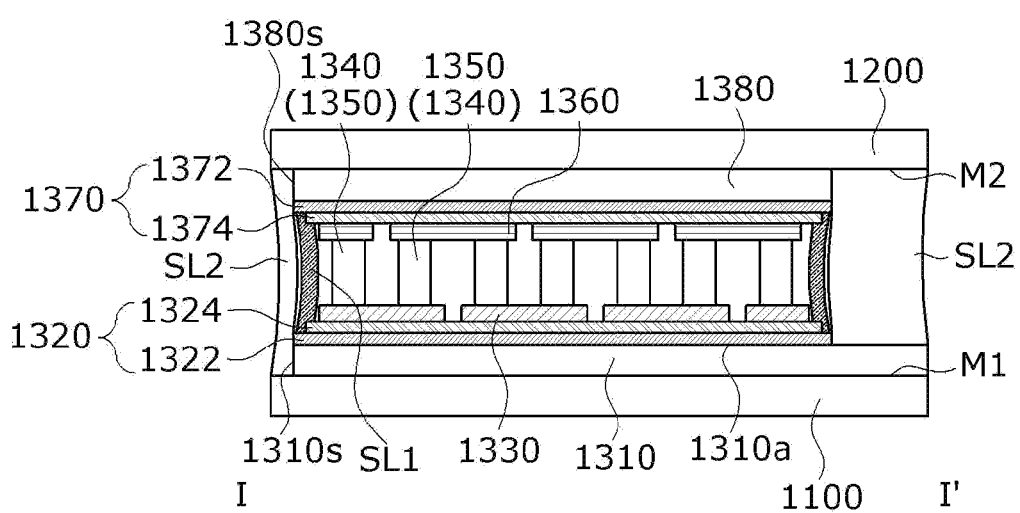
FIG. 13 is a cross-sectional view taken along the line I-I'' in FIG. 12.
Figure 14:
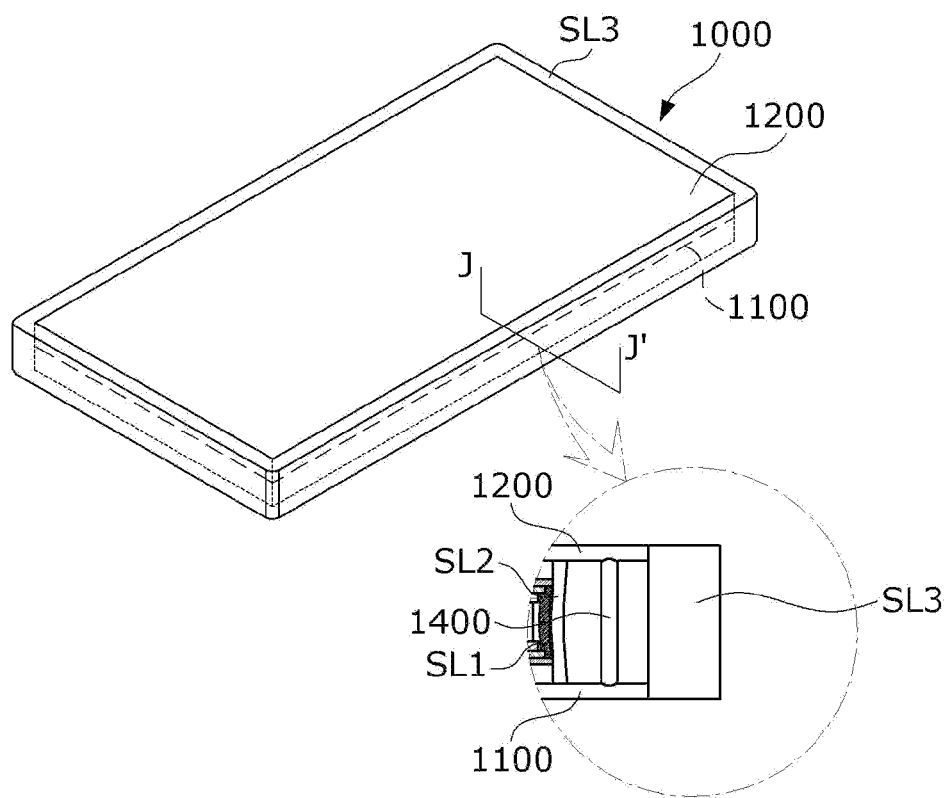
FIG. 14 is a perspective view of a thermoelectric module according to an embodiment of the present disclosure.

FIG. 11 is a view in which a second heat-conducting member is removed from a thermoelectric module according to an embodiment of the present disclosure, FIG. 12 is an enlarged view of the part K in FIG. 11, FIG. 13 is a cross-sectional view taken along the line I-I" in FIG. 12, and FIG. 14 is a perspective view of a thermoelectric module according to an embodiment of the present disclosure.

Referring to FIGS. 11 to 14, in the first substrate of the thermoelectric module according to the embodiment, coupling members such as screws are positioned in the first substrate hole 1310*h*1 and the second substrate hole 1310*h*2 so that the first heat-conducting member 1100 and the first substrate may be coupled to each other. With this configuration, since the thermoelectric element 1300 is coupled to the first heat-conducting member 1100, movement of the thermoelectric element 1300 may be suppressed. Accordingly, as the thermoelectric element 1300 is moved, a phenomenon in which heat is not efficiently transferred from the first pipe and the second pipe described above may be suppressed.

In addition, the coupling member SC is fastened to the first heat-conducting member 1100 having a relatively low temperature, so that structural deformation such as distortion due to heat may be suppressed compared to when the coupling member SC is fastened to the second heat-conducting member having a high temperature. Accordingly, reliability of the thermoelectric module may be improved. In addition, when the coupling member SC is fastened to the second heat-conducting member having the relatively high-temperature, a bending phenomenon may occur due to high temperature, and the power generation performance may be deteriorated due to heat loss. In contrast, the thermoelectric module according to the embodiment prevents the above-described bending phenomenon and performance deterioration, thereby providing improved reliability and power generation performance.

Furthermore, a bonding member may be positioned between the second substrate 1380 and the second heat-conducting member. Accordingly, as described above, the second substrate 1380 and the second heat-conducting member may be coupled to each other. The bonding member includes a thermally conductive material and may be formed of a paste.

As described above, the thermoelectric module may include the electrode connection parts 1390 and 1391 disposed on the first substrate 1310 and electrically connected to the first electrode 1330, the connection units 1392 and 1393 connected to the electrode connection parts 1390 and 1391, and the conductive wire parts EL1 and EL2 electrically connected to the connection units 1392 and 1393 and outwardly connected to the first substrate 1310. The connection units 1392 and 1393 correspond to the first connection unit and the second connection unit described above.

At least a portion of the electrode connection parts 1390 and 1391 may include an overlapping portion DVS, which is vertically overlapped with the first substrate 1310 and the second substrate 1380. In addition, a semiconductor structure may be positioned to the overlapping portion DVS or the overlapping portion DVS may be in contact with the first electrode 1330. As a result, the electrode connection parts may be electrically connected to the first electrode.

The first sealing member SL1 may surround at least a portion of the overlapping portion DVS. For example, the first sealing member SL1 may be at least partially overlapped with the electrode connection parts 1390 and 1391 in a vertical direction. Accordingly, even if the electrode connection parts 1390 and 1391 extend to the outside, that is, an area which is not vertically overlapped with the second substrate 1380 on the first substrate 1310, the semiconductor structures 1340 and 1350 may be protected from moisture and the like.

In addition, the connection units 1392 and 1393 may be surrounded by the second sealing member SL2. In an embodiment, the second sealing member SL2 may be in contact with the outer side surface of the first substrate 1310 and may be in contact with the upper surface 1310*a* of the first substrate 1310 in the area which is not overlapped with the second substrate 1380 vertically (in the first direction) in the first substrate 1310. In other words, the second sealing member SL2 may be in contact with at least a portion of the upper surface 1310*s* of the first substrate 1310. Furthermore, the second sealing member SL2 may be disposed outside the electrode connection parts 1390 and 1391 and the connection units 1392 and 1393 described above. In addition, the second sealing member SL2 may be in contact with the outer side surface 1380*s* of the second substrate 1380. Accordingly, the first sealing member SL1, the lower insulating layer 1320, the first electrode 1330, the semiconductor structures 1340 and 1350, the second electrode 1360, the upper insulating layer 1370, the electrode connection parts 1390 and 1391, and the connection units 1392 and 1393 may be sealed by the second sealing member SL2, the first substrate 1310 and the second substrate 1380. As a result, the first sealing member SL1, the lower insulating layer 1320, the first electrode 1330, the semiconductor structures 1340 and 1350, the second electrode 1360 and the upper insulating layer 1370, and the electrode connection parts 1390 and 1391, and the connection units 1392 and 1393 may be improved in moisture resistance by the second sealing member SL2.

Further, the second sealing member SL2 may be extended from the outer side surface 1310s of the first substrate 1310 to the upper surface (the above-described first surface, M1) of the first heat-conducting member 1100. In addition, the second sealing member SL2 may be extended from the outer side surface 1380s of the second substrate 1380 to the lower surface (the aforementioned second surface, M2) of the second heat-conducting member 1200. As a result, the second sealing member SL2 is coupled to the thermoelectric element 1300, the first heat-conducting member 1100, and the second heat-conducting member 1200, and the coupling force between them may be improved.

In addition, the third sealing member SL3 may be in contact with the first heat-conducting member 1100 and the second heat-conducting member 1200. In particular, the third sealing member SL3 may be in contact with the side surfaces of the first heat-conducting member 1100 and the second heat-conducting member 1200. Accordingly, the third sealing member SL3 may surround the thermoelectric element 1300, the first sealing member SL1, and the second sealing member SL2 between the first heat-conducting member 1100 and the second heat-conducting member 1200. As a result, the third sealing member SL3 may be coupled to the first heat-conducting member 1100 and the second heat-conducting member 1200.

Further, the thermoelectric element 1300, the first sealing member SL1 and the second sealing member SL2 may be shielded by the first heat-conducting member 1100 of the lower portion, the second heat-conducting member 1200 of the upper portion, and the third sealing member SL3 of the outer side. Accordingly, the thermoelectric module or the thermoelectric element therein may be protected from external foreign substances, moisture, and the like.

In addition, the third sealing member SL3 may entirely surround the first heat-conducting member 1100 and the second heat-conducting member 1200. Accordingly, the third sealing member SL3 may perform heat dissipation from the first heat-conducting member 1100 and the second heat-conducting member 1200.

The thermoelectric element according to the embodiment of the present disclosure may be applied to a power generating apparatus or the like. That is, the above description may be equally applied to a power generating apparatus or various electric apparatus including the thermoelectric element according to the embodiments. For example, the power generation system may generate power by heat sources generated from waste heat pipes such as heat transfer pipes, rainwater pipes, and smelting pipes, ships, automobiles, power plants, geothermal heat, and the like. In addition, in the power generation system, a plurality of power generating apparatuses may be arranged to efficiently converge heat sources.

Although the preferred embodiments of the present disclosure have been described above, it may be understood by those skilled in the art that a variety of modifications and changes may be made without departing from the concept and scope of the present disclosure disclosed within the range of the following claims.

The invention claimed is:

1. A thermoelectric module comprising:
a first heat-conducting member;
a second heat-conducting member;
a thermoelectric element disposed between the first heat-conducting member and the second heat-conducting member;
a first sealing member disposed outside the thermoelectric element; and
a second sealing member disposed outside the first sealing member,
wherein the thermoelectric element includes a first substrate, a second substrate facing the first substrate, and a semiconductor structure disposed between the first substrate and the second substrate,
wherein the first sealing member is disposed between an upper surface of the first substrate and a lower surface of the second substrate, and includes a convex side surface toward the semiconductor structure,
wherein the second sealing member is in contact with a side surface of the first substrate and a side surface of the second substrate, and the second sealing member has a structure which is convex toward the inside or concave toward the outside like the convex side surface of the first sealing member,
wherein a gap is provided between the second sealing member and the convex side surface of the first sealing member,
wherein the thermoelectric element further includes a first insulating layer disposed on the first substrate and a second insulating layer disposed on the first insulating layer, and
wherein the first sealing member is in contact with the first insulating layer and the second insulating layer.

2. The thermoelectric module of claim 1, wherein the first heat-conducting member is connected to a first flow path,
wherein the second heat-conducting member is connected to a second flow path, and
wherein the temperatures of the fluids flowing in the first flow path and the second flow path are different from each other.

3. The thermoelectric module of claim 1, wherein the first sealing member includes a first region in contact with the first insulating layer, and a second region in contact with the second insulating layer.

4. The thermoelectric module of claim 3, wherein the first insulating layer includes a first insulating part which is vertically overlapped with the second insulating layer and a second insulating part which is not vertically overlapped with the second insulating layer, and
wherein the first region of the first sealing member is positioned in the second insulating part, and the second region of the first sealing member is positioned in the first insulating part.

5. The thermoelectric module of claim 1, wherein an outer side surface of the first sealing member is concave outward toward the semiconductor structure.

6. The thermoelectric module of claim 5, wherein the upper surface of the second insulating layer includes a concave portion concave toward the second substrate, and
wherein the outer side surface of the first sealing member and the upper surface of the second insulating layer are concave in a direction perpendicular to each other.

7. The thermoelectric module of claim 1, further comprising a third sealing member disposed outside the second sealing member, wherein the third sealing member is in contact with the first heat-conducting member and the second heat-conducting member, and wherein the first sealing member, the second sealing member and the third sealing member are spaced apart from each other.

8. The thermoelectric module of claim 7, wherein the first sealing member and the second sealing member include the same material, wherein the first sealing member and the third sealing member include different materials, and wherein the third sealing member includes urethane.

9. The thermoelectric module of claim 7, wherein a height of the first sealing member, a height of the second sealing member, and a height of the third sealing member are different from each other.

10. The thermoelectric module of claim 7, further comprising:

wherein an electrode connection part disposed on the first substrate and electrically connected to a first electrode; and wherein a conductive wire part connected to the electrode connection part and extending outside the first substrate, wherein the first electrode is disposed on the second insulating layer.

11. The thermoelectric module of claim 10, wherein the electrode connection part includes an overlapping portion which is vertically overlapped with the first substrate and the second substrate, and wherein the first sealing member at least partially surrounds the overlapping portion.

12. The thermoelectric module of claim 11, further comprising a connection unit disposed on the electrode connection part and electrically connected to the conductive wire part, wherein the second sealing member surrounds the connection unit.

13. The thermoelectric module of claim 12, wherein the second sealing member is in contact with at least a portion of the upper surface of the first substrate.

14. The thermoelectric module of claim 13, wherein the third sealing member is in contact with the first heat-conducting member and the second heat-conducting member.

15. The thermoelectric module of claim 14, wherein a width of the third sealing member is greater than a width of the first sealing member.

16. The thermoelectric module of claim 15, wherein a width of the second sealing member is greater than the width of the first sealing member.

17. The thermoelectric module of claim 14, wherein the second sealing member extends from the outer side surface of the first substrate to the upper surface of the first heat-conducting member, and extends from the outer side surface of the second substrate to the lower surface of the second heat-conducting member.

18. The thermoelectric module of claim 17, wherein the second sealing member couples the thermoelectric element, the first heat-conducting member, and the second heat-conducting member.

19. The thermoelectric module of claim 18, wherein the third sealing member couples the first heat-conducting member and the second heat-conducting member.

* * * * *